United States Patent [19]

Schlig

[11] 4,375,059

[45] Feb. 22, 1983

[54] FAST CHARGE TRANSFER ANALOG-TO-DIGITAL CONVERTER

[75] Inventor: Eugene S. Schlig, Somers, N.Y.

[73] Assignee: IBM Corporation, Armonk, N.Y.

[21] Appl. No.: 143,704

[22] Filed: Apr. 25, 1980

[51] Int. Cl.³ .......................................... H03K 13/08
[52] U.S. Cl. ............................. 340/347 AD; 357/24; 340/347 M
[58] Field of Search .................... 340/347 M, 347 AD; 357/24; 307/221 D, 221 C

[56] References Cited

U.S. PATENT DOCUMENTS

| | | | |
|---|---|---|---|
| 3,100,298 | 8/1963 | Fluhr | 340/347 AD |
| 3,156,913 | 11/1964 | Crocker et al. | 340/347 AD |
| 4,072,938 | 2/1978 | Buchanan | 340/347 AD |
| 4,072,939 | 2/1978 | Heller et al. | 340/347 AD |

OTHER PUBLICATIONS

Taub, Restandardizing Circuits for Analogue CCD Shift Register, IBM Technical Disclosure Bulletin, vol. 20, No. 1, 6/1977, pp. 379–382.

Primary Examiner—T. J. Sloyan

Attorney, Agent, or Firm—Pollock, Vande Sande & Priddy

[57] ABSTRACT

A charge coupled device analog-to-digital converter includes a plurality of charge storage stages that are arranged in a serial pipeline register and are connected to pass input source charges from stage to stage down the pipeline register. A reference charge generator and a charge splitter at each stage generate two fixed reference signals. The first of the reference signals is compared by a comparator to a source charge that is temporarily stored at the stage. The comparator generates a binary 1 if the source charge is greater than or equal to the first reference charge and a binary 0 if the source charge is less than the first reference charge. If a binary 1 is generated, only the stored contents of the stage pass to the next successive stage. However, if a binary 0 is generated, the charge contents of the stage is passed to a next successive stage and the second reference charge is also passed by a transfer gate to the next successive stage, where the charges are combined. Buffer registers are provided to temporarily store the output bits of the comparators of the stages to form a digital word for each source charge packet as the packet and associated added charge components leave the pipeline.

13 Claims, 13 Drawing Figures

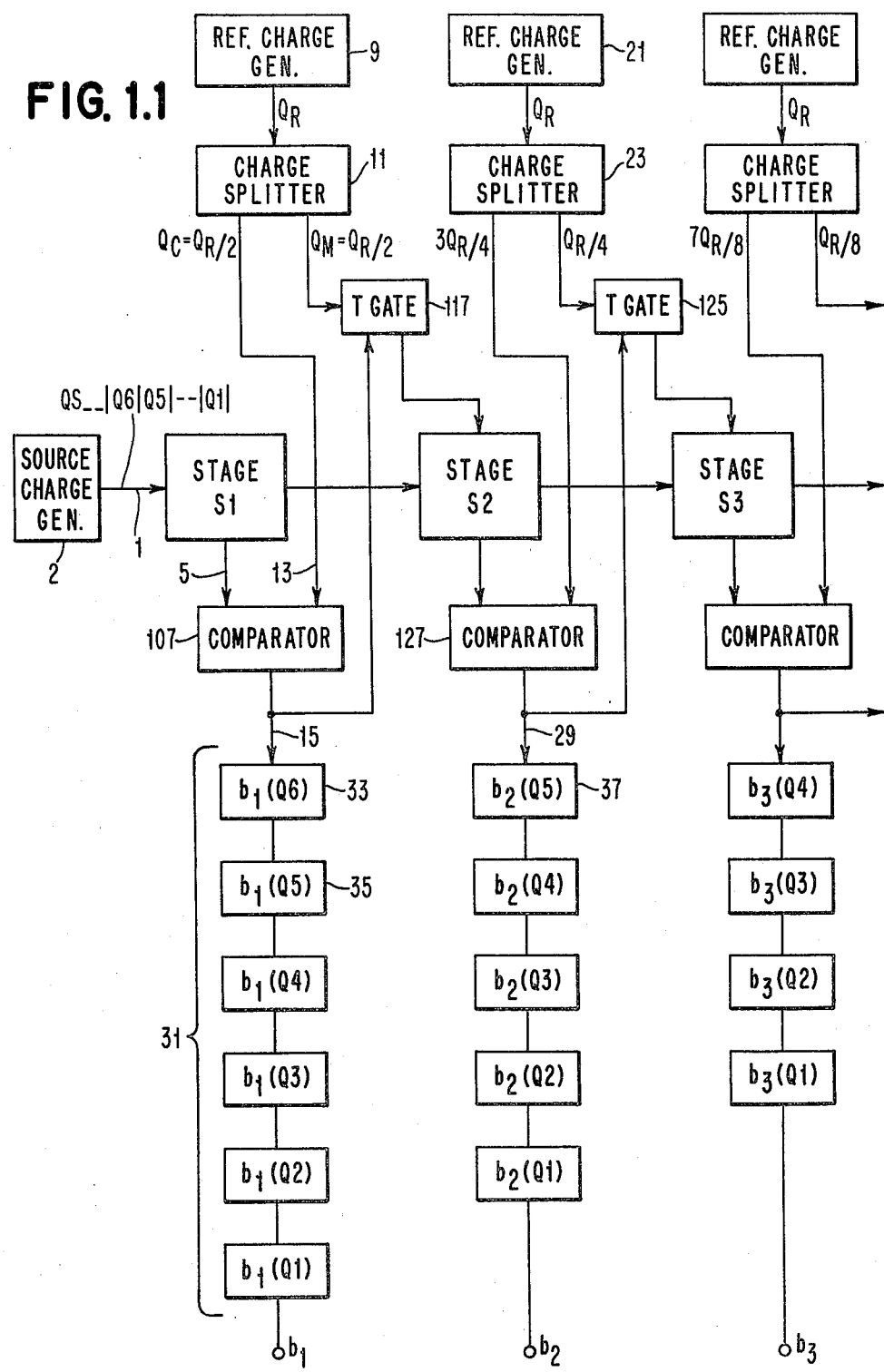

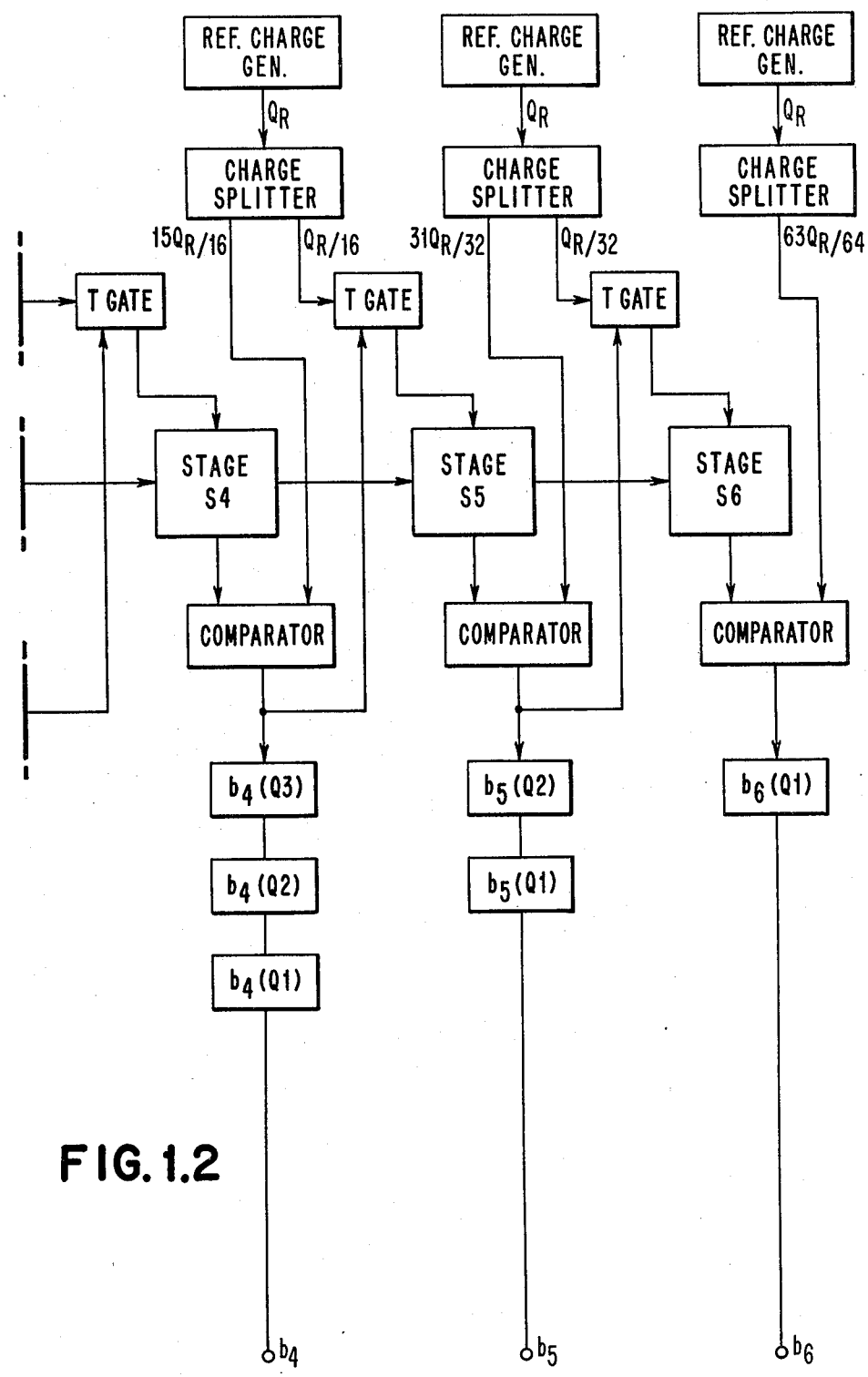
FIG.1.2

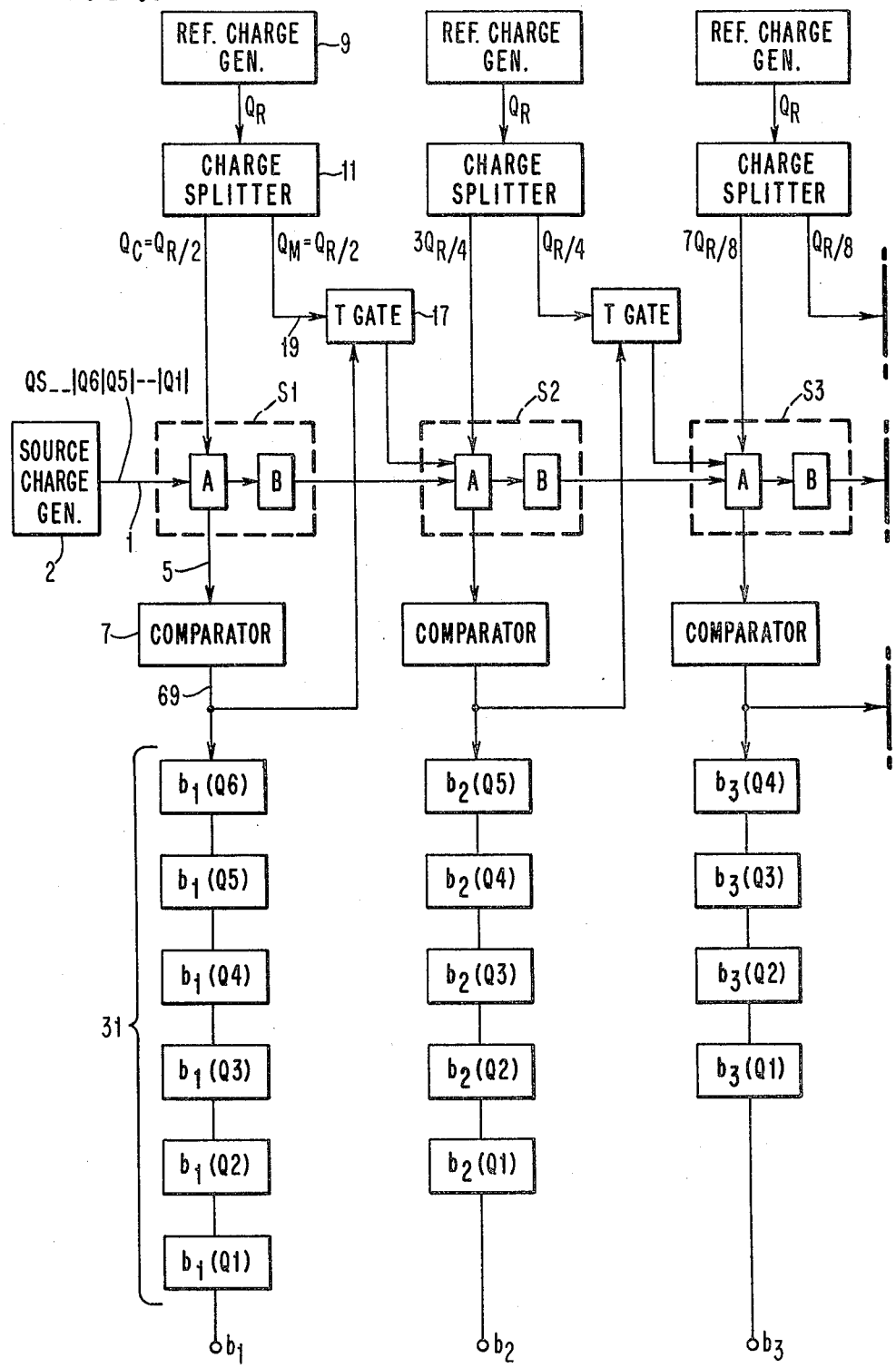
FIG. 2.1

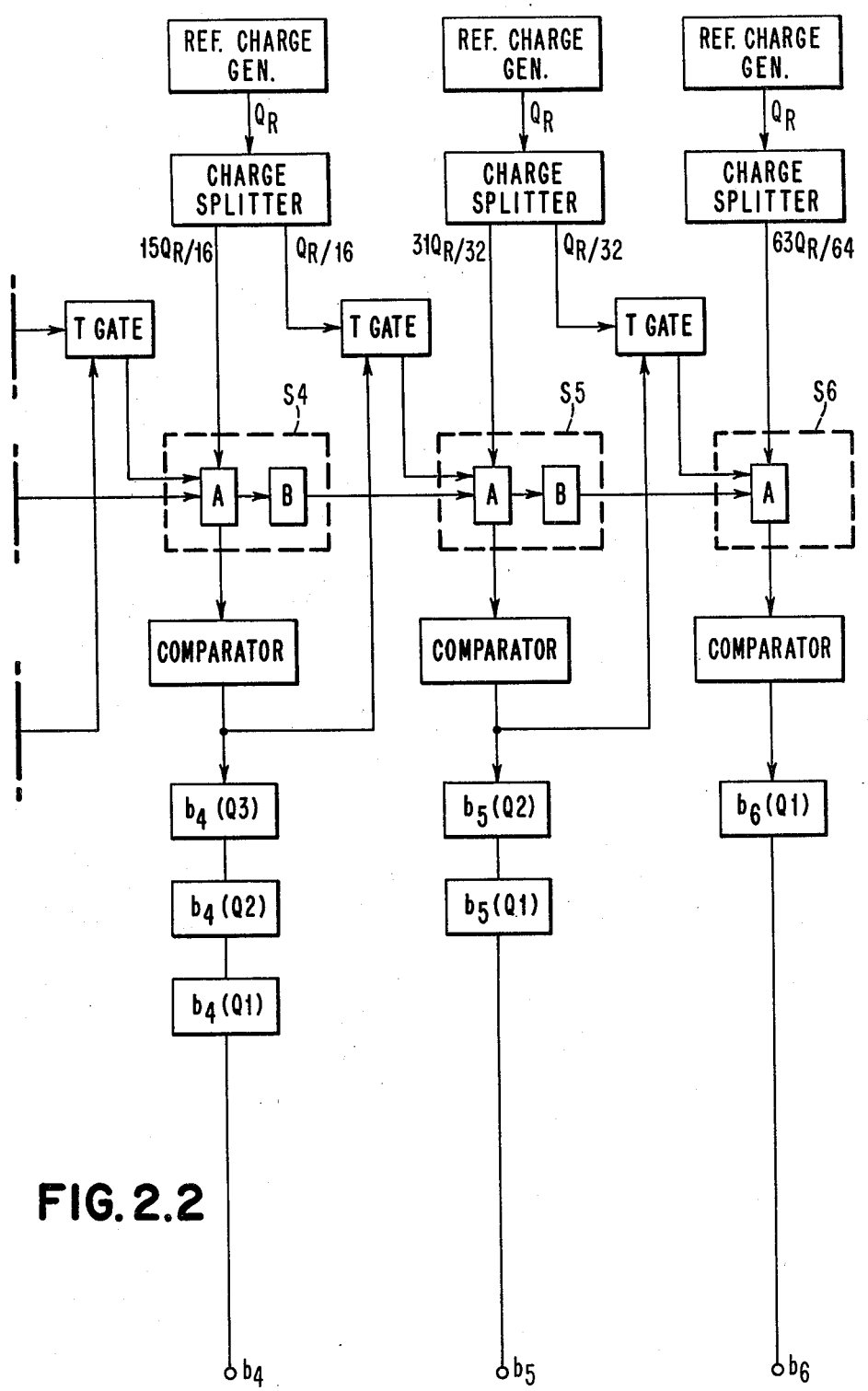
FIG. 2.2

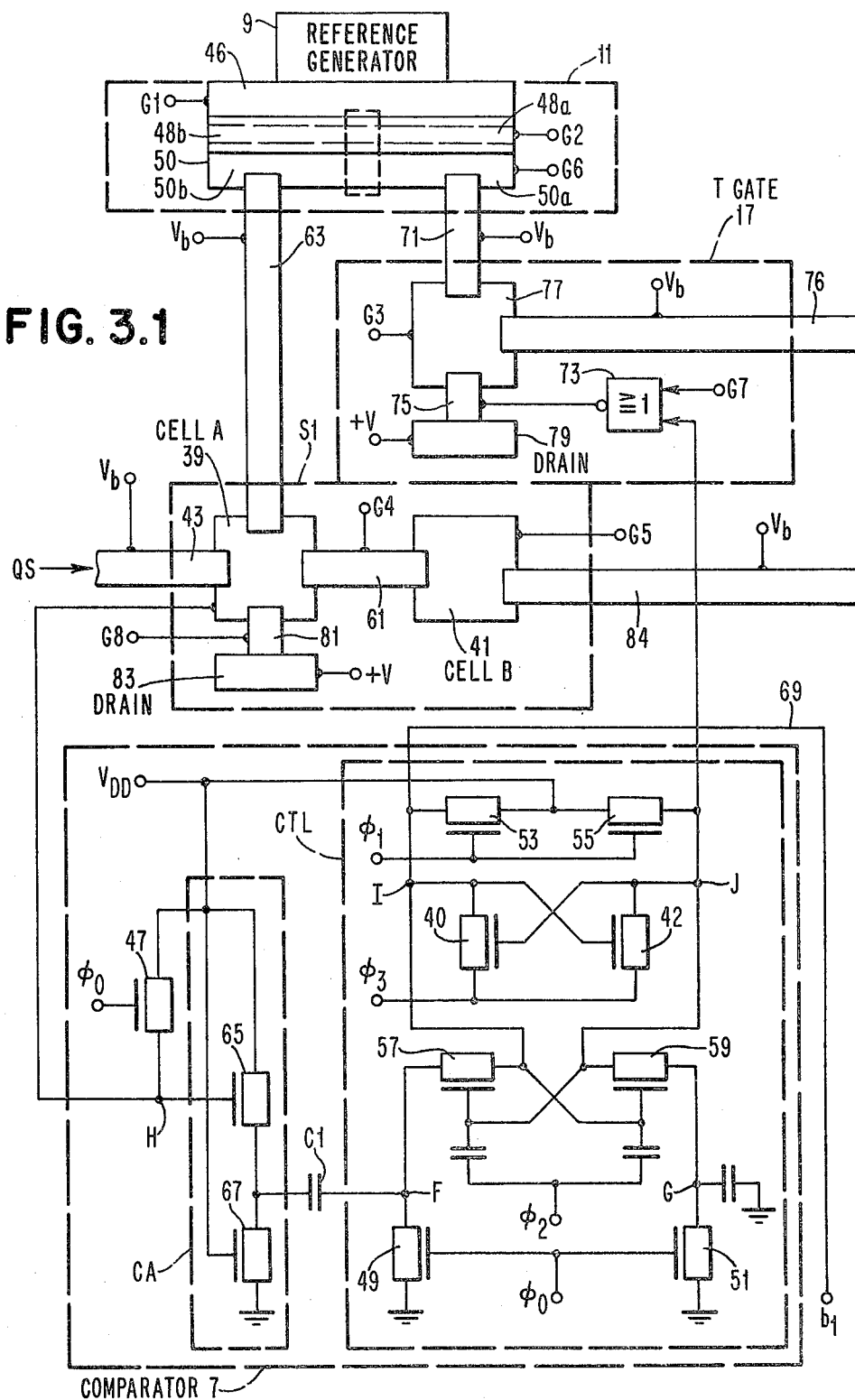
FIG. 3.1

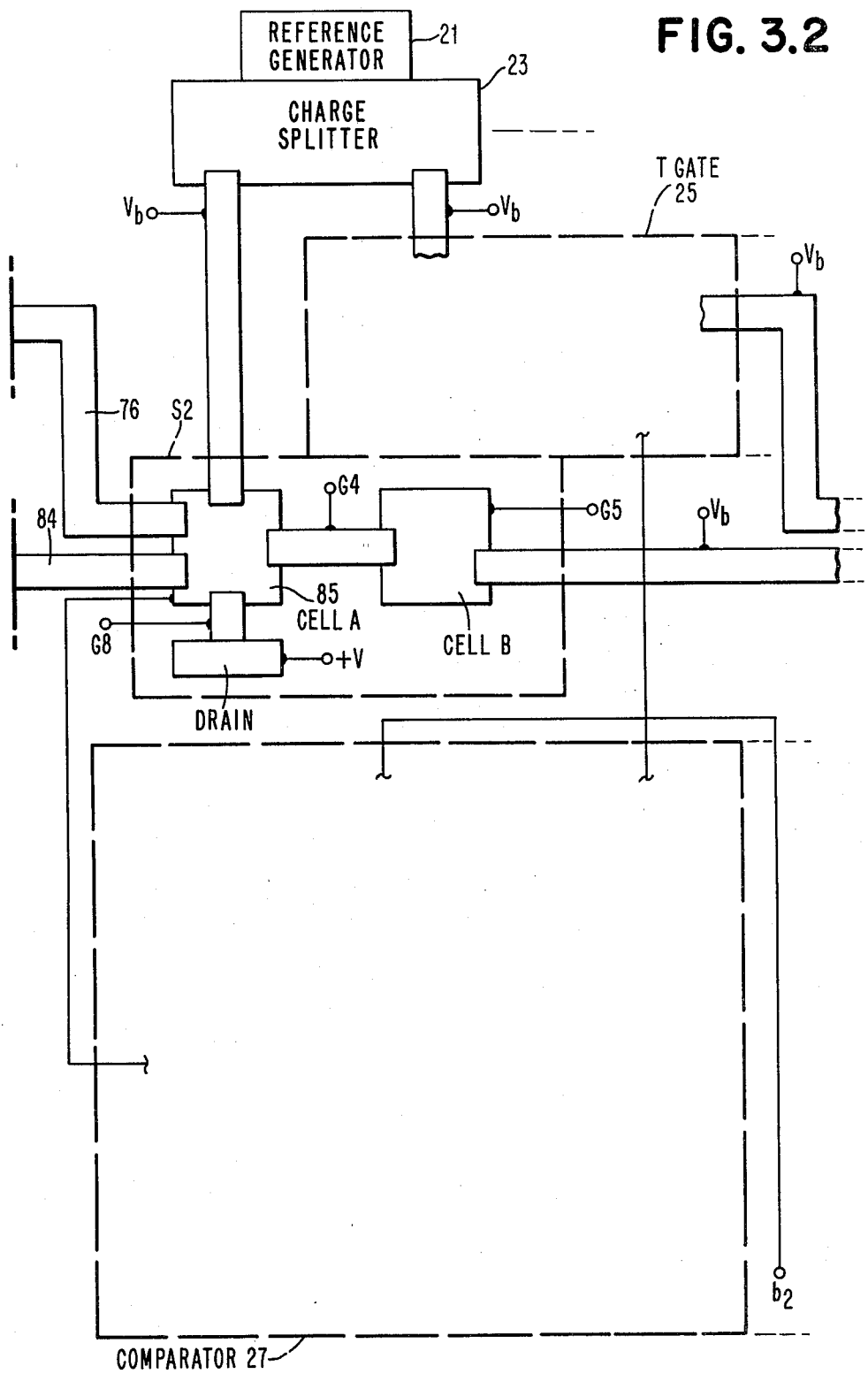
FIG. 3.2

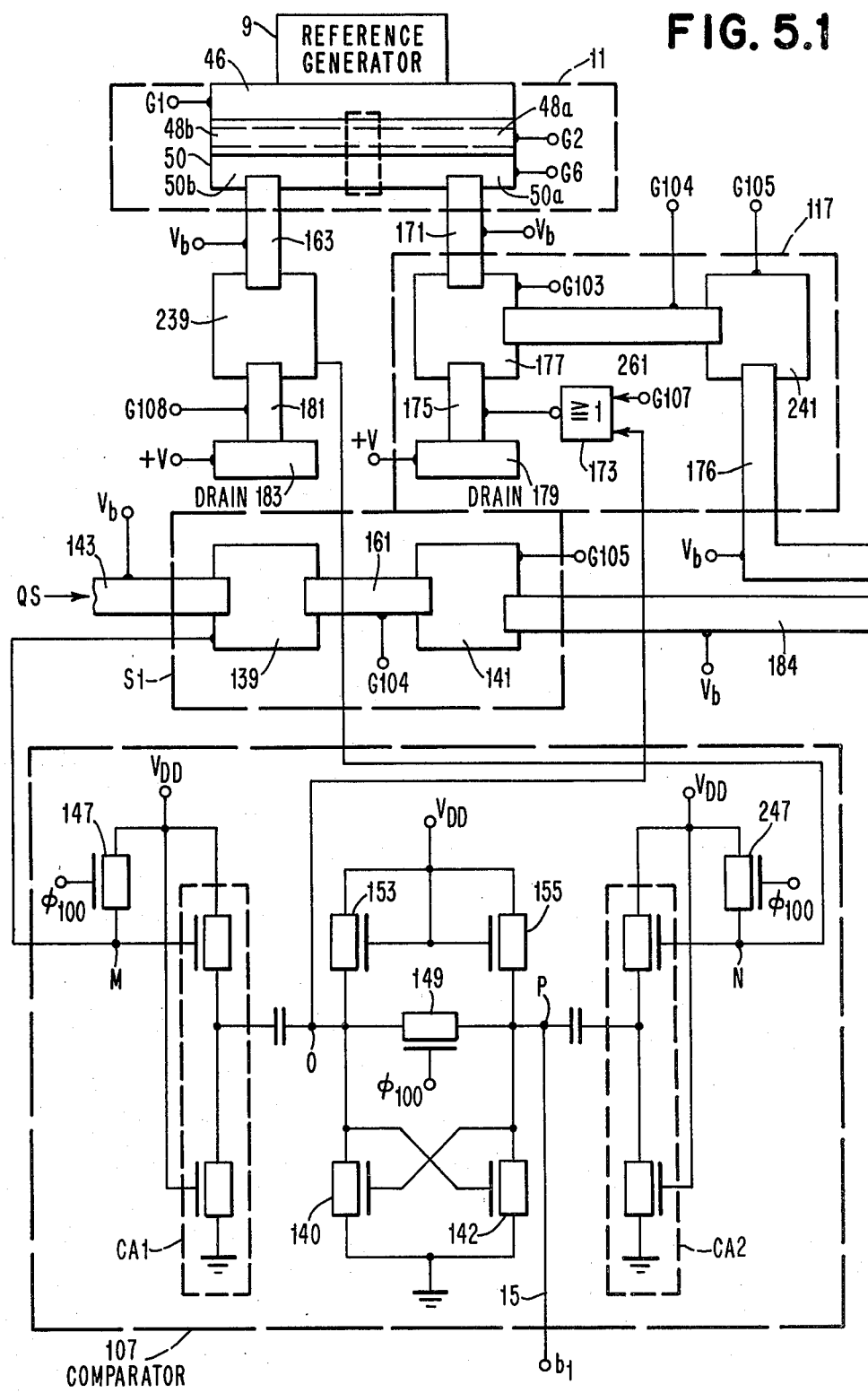
FIG. 5.1

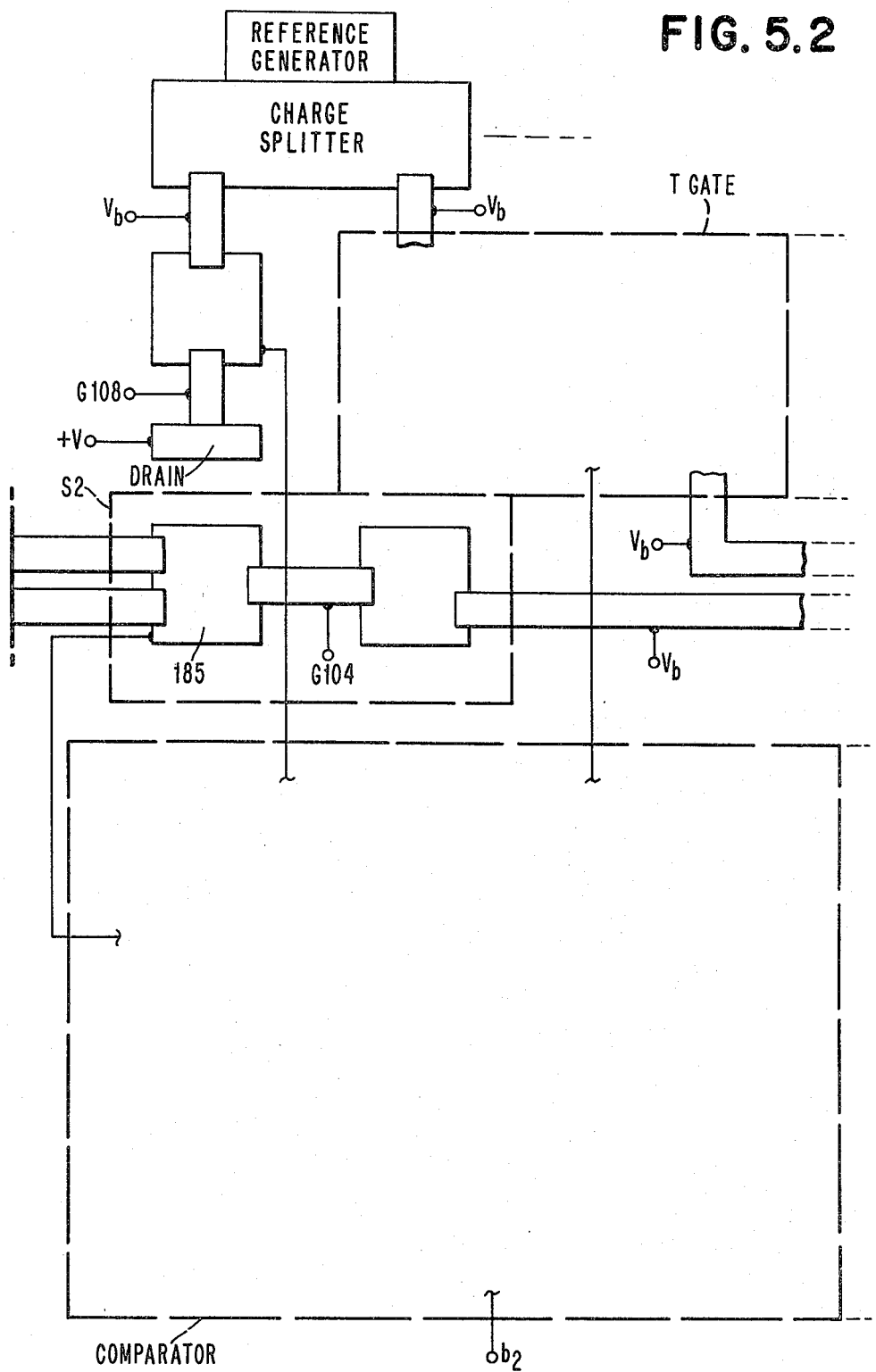
FIG. 5.2

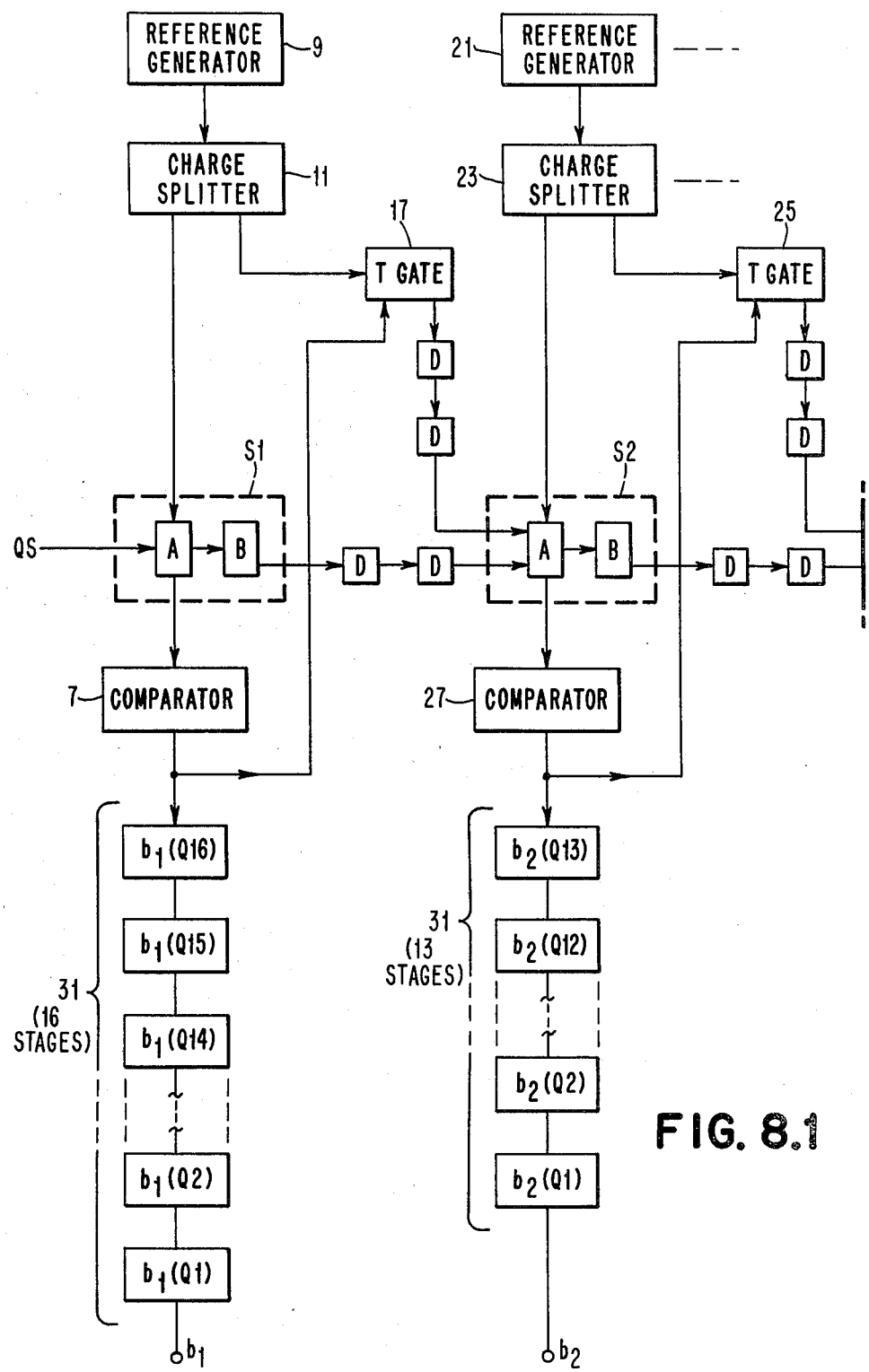
FIG. 8.1

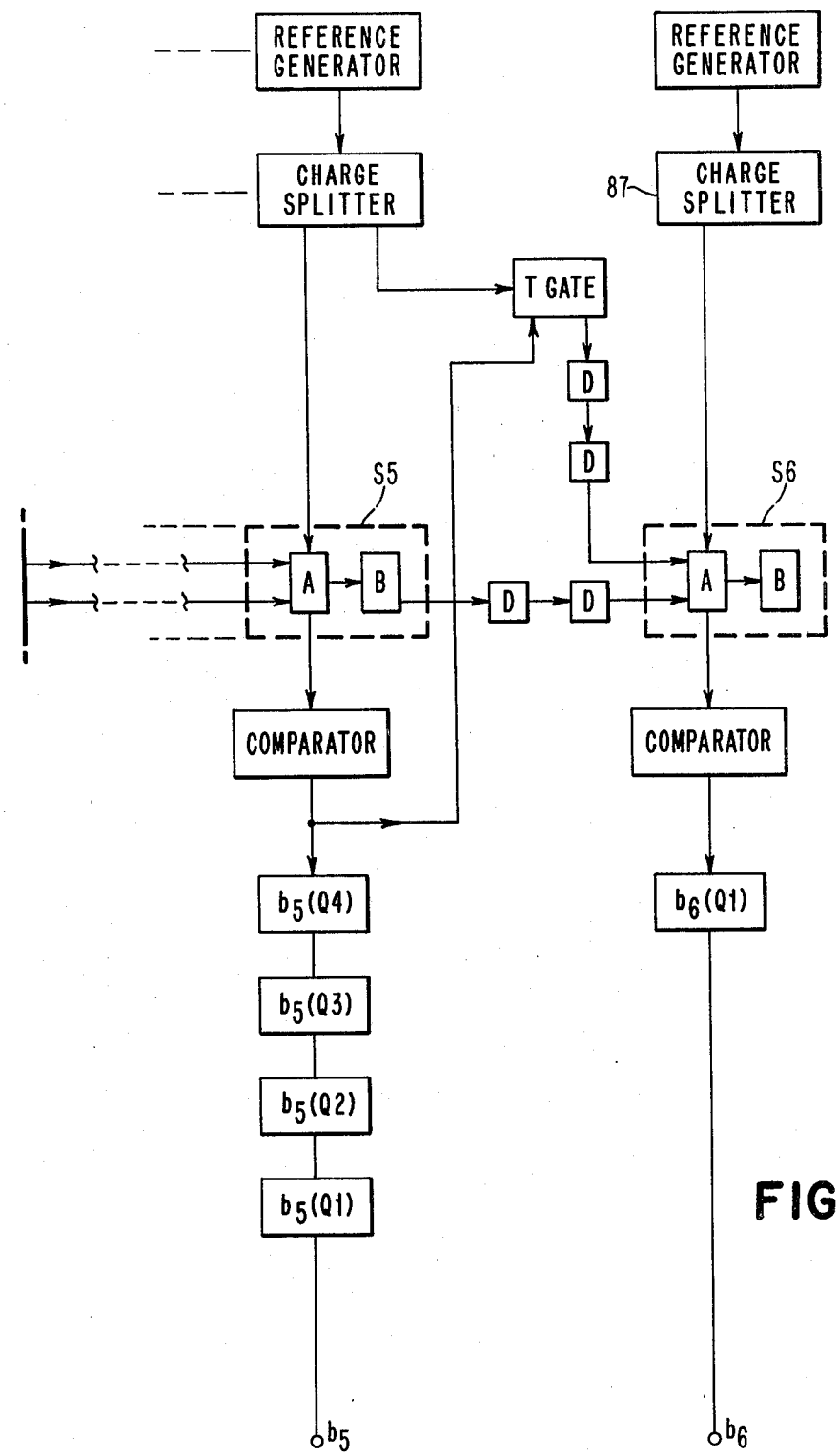
FIG. 8.2

FAST CHARGE TRANSFER ANALOG-TO-DIGITAL CONVERTER

DESCRIPTION

1. Technical Field

The invention relates to an improved charge coupled analog-to-digital converter and, more particularly, to such a converter that utilizes a relatively simple charge coupled circuit to generate a digital representation of the magnitude of each charge packet of a stream of charge packets. The improved analog-to-digital converter operates in a pipelined mode and utilizes a successive approximation analysis to generate the digital representations of the charge packets.

2. Background Art

The operation of charge coupled devices (CCD's) is well-known in the art and such devices are used for many diverse purposes, for example as image scanners, signal processors and multi-level stores. However, the charge packets that are produced by such devices must often be converted to corresponding digital signals that are more easily transmitted over long distances and that may be used by a digital computer for computational purposes.

A typical electronic analog-to-digital converter is disclosed in the U.S. patent to Gerdes, U.S. Pat. No. 3,968,486, issued July 6, 1976. The converter utilizes a plurality of analog comparators that compare a common analog voltage input to separate reference voltages and generate binary bits in accordance with the results of the comparisons. The output state of each comparator is dependent upon the output state of associated higher order comparators and the resolution of the disclosed analog-to-digital converter is dependent upon the number of stages of comparators that are utilized in the converter. The outputs of the comparators form a digital word that corresponds to the magnitude of the common analog input.

The disclosed converter of Gerdes is not utilized to convert the magnitude of a charge packet to a digital representation but is, instead, employed to generate a digital representation of an input analog voltage. Thus, the apparatus of Gerdes is not well-suited for use in a charge coupled environment, since additional hardware must be provided to convert charge to voltage and the charge conversion generally introduces additional random noise.

In addition, the apparatus of Gerdes is somewhat complicated and operates relatively slowly since a successive approximation technique is employed, wherein the output state of each comparator stage of the apparatus is dependent upon the serially generated output states of associated higher order comparators. Also, the converter of Gerdes requires a relatively large amount of communicating conductors to transmit information between comparators and, this additional apparatus adds to the complexity and bulk of the converter.

A charge coupled analog-to-digital converter is disclosed in an IBM Technical Disclosure Bulletin, by Pan, Yee and Terman, Vol. 21, No. 5 (October 1978). The disclosed CCD analog-to-digital converter has the advantage that it may be employed to convert a charge packet to a corresponding digital representation without having to provide an intermediate charge to voltage conversion, for example, as would be required for the apparatus of Gerdes. Also, the CCD converter is compatible with CCD charge generating devices and, therefore, may be more easily used with such devices.

The disclosed CCD converter is a "ramp" type converter that generates a digital representation of a charge packet by decreasing the depth of a potential well containing the signal charge in a step-wise fashion and testing at each step for an overflow of charge. A binary number is generated in accordance with the particular step at which overflow is detected. The ramp converter must cycle through all of the possible values of the binary number until overflow is detected before it may begin to analyze the next successive charge packet. Accordingly, the ramp-type CCD analog-to-digital converter tends to be slow and, therefore, is not suitable for use with CCD devices that rapidly generate charge packets.

A relatively fast CCD analog-to-digital converter is disclosed in a U.S. application of Y. S. Yee et al, Ser. No. 47,557, filed June 11, 1979. The converter utilizes a pipelined system wherein a plurality of digitizing stages are serially arranged so that a charge packet may be passed down the "pipeline" of stages. As a charge moves down the pipeline, each stage generates a successive lower order digital bit and, when the charge leaves the pipeline, the previously generated bits are combined to form a digital word that represents the magnitude of the charge with a degree of precision that is determined by the number of digitizing stages of the pipeline.

As a source charge packet is moved down the pipeline, each successive stage compares a reference charge to a source charge packet and generates a binary digit in accordance with the result of the comparison. The source charge is modified as it progresses from stage to stage of the pipeline in a manner dependent upon the digital bit generated at each stage. The reference charge that is compared at each stage is defined by a successive approximation algorithm that is known in the art and is determined in part by the binary bits that are generated by preceding stages of the pipeline.

The pipelined analog-to-digital converter is much faster than the above-described ramp type converter, due to the fact that the pipelined operation allows many charges to be simultaneously engaged in the digitizing process. Thus, a continuous stream of charge packets may be applied at the input of the pipeline and each charge may be passed synchronously down the pipeline so that as one charge moves from a particular stage to a next successive stage, an adjacent following charge will move into the newly vacated stage.

The pipelined system of the Yee et al application utilizes a digital-to-analog converter at each stage to generate the reference voltage for the stage, in accordance with the identity of the digital bits that are generated at previous stages of the pipeline. The reference digital-to-analog converters and the logic circuitry that operates the converters are fairly complex and also take up a substantial amount of space. In addition, many conducting lines are required to feed the output bits of each stage to all succeeding stages, thereby taking up even more space. Moreover, delay lines are required to properly synchronize the binary bit inputs for each stage, thereby adding additional complexity to the circuit of the converter and also taking up additional space. The logic circuitry of the reference digital-to-analog converters and the associated delay lines also tend to slow the digitizing operation at each stage of the pipeline and, therefore, decrease the overall efficiency of the digital conversion process.

The complexity of the system of the Yee et al application is substantially increased for each stage that is added to the pipeline, since the control logic circuit for each added stage must receive and decode the binary bits that are generated at all of the previous stages. Thus, the complexity of the control logic circuitry and associated binary bit lines is substantial for a fairly accurate analog-to-digital converter, for example a converter having six output bits.

Another CCD pipelined successive approximation analog-to-digital converter is described at pages 92–94 of an article by M. F. Tompsett entitled "Video-Signal Generation" and included in the book "Electronic Imaging", edited by T. P. McLean and P. Schagen and published in 1979 by Academic Press. At each stage, a quantity of reference charge is subtracted from a source charge and a comparator determines whether a positive remainder exists. When a positive remainder is detected, a corresponding binary digit is set to 1, the remainder is passed on to the next successive stage and the subtracted reference charge is discarded. If a positive remainder is not detected at a stage, the corresponding binary digit is set to zero and the reference charge is returned to the pipeline to be passed on to the next stage.

While avoiding much of the complexity of the system of the Yee et al application, the Tompsett system has the disadvantage of requiring a quantity of charge to be subtracted from the source charge. In the CCD art, subtraction of charge is a time consuming process when compared with the addition of charge. Also, the charge subtraction process is subject to inaccuracies because the charge capacity of a potential well and the relative capacities of potential wells of different areas of a CCD are subject to error.

Accordingly, it is an object of the invention to provide a relatively simple and compact CCD analog-to-digital converter that operates in a pipelined mode to rapidly digitize a serial stream of charge packets by a process of successive approximation.

Another object of the invention is to provide such a CCD analog-to-digital converter that digitizes source charge packets at stages along the pipeline and that generates at each stage a fixed reference charge that is the same at each stage and is divided at each stage into fractional charges that are independent of the binary bits that are generated at previous stages.

A further object of the invention is to provide a CCD analog-to-digital converter that generates digital bits by successive approximation by modifying the charge packets in the pipeline rather than the associated reference charges of the stages of the pipeline.

Another object of the invention is to provide a CCD analog-to-digital converter that utilizes a relatively simple and accurate charge splitter to generate fixed reference charges for each station of a CCD pipeline.

A further object of the invention is to provide a CCD analog-to-digital converter that is sufficiently compact to be supported on the same chip that supports an associated charge-generating CCD apparatus.

Another object of the invention is to provide a CCD analog-to-digital converter that operates without requiring charge to be subtracted.

These and other objects of the invention will become apparent from a review of the detailed specification which follows and a consideration of the accompanying drawings.

DISCLOSURE OF THE INVENTION

In order to achieve the objects of the invention and to overcome the problems of the prior art, the CCD analog-to-digital converter, according to the invention, includes a plurality of serially arranged pipeline stages that are connected to pass source charge packets in a serial direction. Each stage of the pipeline has a reference generator that generates a reference charge packet $Q_R$ having a magnitude that corresponds to the maximum possible value of charge for an input source charge packet.

The maximum reference charge $Q_R$ of a stage is applied to a charge splitter that splits the charge into a comparator charge component $Q_R - Q_R/2^n$ and a modification charge component $Q_R/2^n$, where n is an index number that designates the position of the stage in the pipeline. The first stage at the input of the pipeline is designated 1 and successive stages have successively incremented index numbers.

A comparator of each stage receives the input source charge that is stored at the stage and compares the input source charge to the comparator charge from the associated charge splitter of the stage. If the input source charge of the stage is greater than or equal to the comparator charge, a binary bit 1 is generated for the stage and the source charge is passed to the next successive stage. If the input source charge of the stage is less than the comparator charge, a binary 0 is generated for the stage, the source charge is passed to the next successive stage and a transfer gate of the stage applies the modification charge to the next successive stage, to be added to the source charge.

Thus, if a binary 0 is generated at the stage, the next successive stage receives a summed charge packet that corresponds to the sum of the source charge and the modification charge of the previous stage. If a stage generates a binary 1, the source charge of the stage is passed to the next succeeding stage and the transfer gate of the stage blocks the modification charge of the stage so that the next succeeding stage receives only the source charge packet.

Accordingly, a source charge is passed from stage to stage down the pipeline and an additional modification charge component is added to the source charge whenever a stage generates a binary 0. Thus, the successive approximation is achieved by modifying the source charge as it passes down the pipeline and by utilizing fixed reference charges at each stage of the pipeline.

The binary bits that are generated at the output of each stage may be stored by buffer register. When a source charge leaves the pipeline, the associated binary bits are stored at particular positions in the buffer registers so that the bits appear at the same time at parallel digital output terminals.

BRIEF DESCRIPTION OF THE DRAWINGS

FIGS. 1.1 and 1.2 illustrate a block diagram of a six-bit CCD analog-to-digital converter, optimized for high speed operation, in accordance with the invention.

FIGS. 2.1 and 2.2 illustrate a block diagram of a six-bit CCD analog to digital converter, optimized for high precision, in accordance with the invention.

FIGS. 3.1 and 3.2 show a plan view of two CCD stages of the converter of FIGS. 2.1 and 2.2, a circuit diagram of a comparator for one of the stages and a schematic plan view of a charge splitter for one of the stages.

FIGS. 5.1 and 5.2 show a plan view of two CCD stages of the converter of FIGS. 1.1 and 1.2 and a diagram of a comparator for one of the stages.

FIGS. 8.1 and 8.2 illustrates a block diagram of the converter of FIGS. 2.1 and 2.2 with delay stages.

BEST MODE FOR CARRYING OUT THE INVENTION

Figure 4:
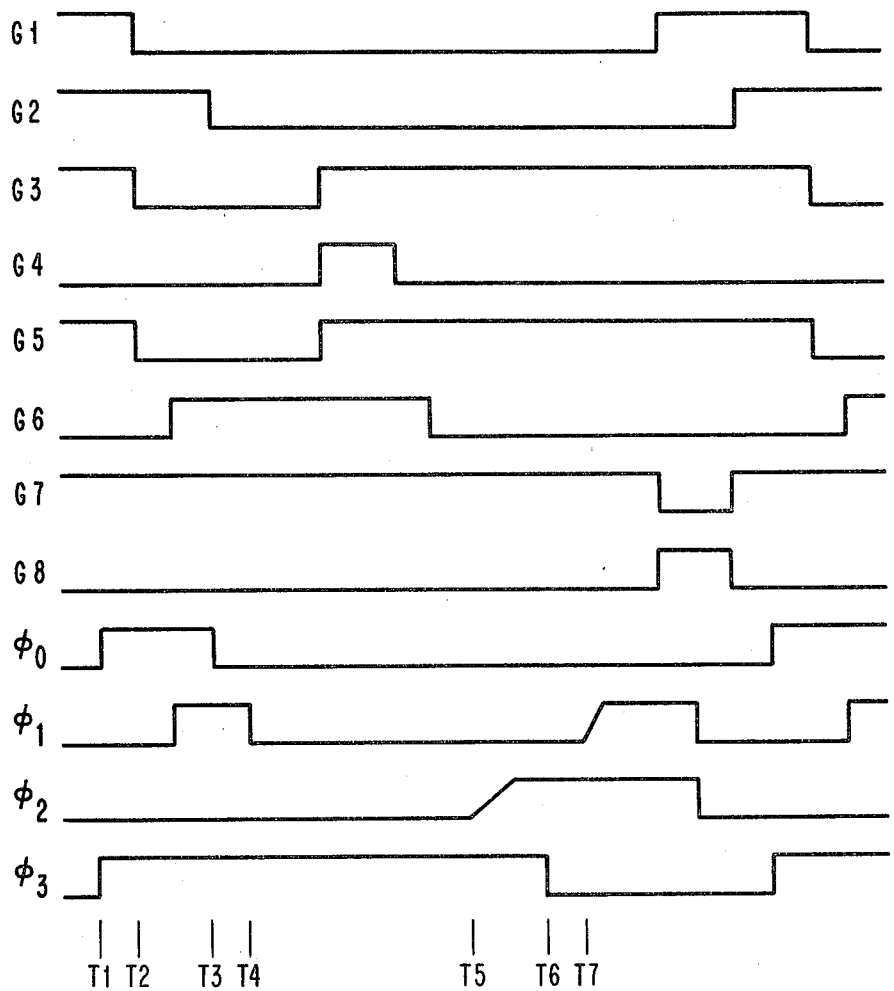
FIG. 4 illustrates a timing diagram of control signals for the converter of FIGS. 3.1 and 3.2.

The remaining portion of this specification will describe preferred embodiments of the invention when read in conjunction with the attached drawings, in which like reference characters identify identical apparatus.

FIGS. 1.1 and 1.2 illustrate a block diagram of a six-bit (or six stage) CCD analog-to-digital converter, in accordance with the invention. The converter is comprised of six charge storage stages S1, S2, S3, S4, S5 and S6 that are serially arranged and interconnected to pass a stream of input source charges for example, Q1, Q2, Q3, Q4, Q5 and Q6 in a serial direction.

The stages S1–S6 form a "pipeline" down which the source charges pass and, as a source charge is received at each stage, digitizing apparatus associated with the stage compares the received charge packet and an associated reference charge packet and generates a binary bit in accordance with a known, successive approximation mathematical algorithm for analog-to-digital converters.

Although a given charge packet must pass through all of the digitizing stages S1–S6, it should be understood that a following charge packet need not wait for the complete processing of the first charge packet before entering the pipeline. Thus, a serial stream of source charges may be applied to an input 1 of the pipeline and the charges may be gated down the pipeline so that as a charge moves from one stage to the next successive stage, a following charge is passed to the vacated stage. Accordingly, the pipeline system of the invention utilizes a series of sequentially arranged stages S1–S6 that may simultaneously operate on different source charge packets as the packets propagate down the pipeline, thereby providing a relatively rapid means for digitizing the packets.

In operation, the first stage S1 of the pipeline determines the most significant bit for a digital approximation of the magnitude of an input charge packet. Thereafter, successive stages define successively less significant bits for the digital approximation of the magnitude of the packet. The number of stages in the pipeline determines the degree of precision of the digital word that is derived for the charge packet. The preferred embodiment of FIGS. 1.1 and 1.2 utilizes six stages to generate six-bit digital approximations for source charge packets. However, it should be understood that any number of stages may be employed to derive a digital word of any desired precision, without departing from the spirit of the invention.

The general mathematical algorithm for successive-approximation in analog-to-digital converter systems is well-known in the art and may be expressed in a variety of forms through algebraic manipulation. Of course, each form of the algorithm gives rise to a different physical implementation for an analog-to-digital converter. The apparatus of the invention makes use of a form of the algorithm which is particularly well-suited for implementation by CCD apparatus. The algorithm provides a test at each stage of the pipeline of FIGS. 1.1 and 1.2 to determine if a charge stored at a stage of the pipeline is greater than or equal to a corresponding reference charge at the stage. The algorithm may be expressed as:

$$QS + \sum_{x=1}^{n-1} [(\bar{b}_x) \cdot (Q_R/2^x)] \geq Q_R - Q_R/2^n,$$

where QS is the source charge that is applied at the pipeline input 1, $\bar{b}_x$ is the complement or inverse of a particular bit that is generated by a preceding stage, $Q_R$ is a reference charge corresponding to the maximum possible source charge, and n is an integer that designates the particular stage at which the algorithm test is being executed. If the equation is satisfied, that is if the quantity on the left side of the equation is greater than or equal to the quantity on the right side of the equation, a binary 1 is defined for the bit $b_n$ of the stage n. Likewise, if the equation is not satisfied, a binary 0 is defined for the stage n.

For example, for the stage S1, a charge generator 2 such as a CCD image scanner or a CCD filter, applies an input source charge packet Q1 at the pipeline input 1. The input source packet Q1 is received and stored in the stage S1 and is applied to an input 5 of a comparator 107 that is known to the art and that will be described in more detail hereafter. A reference charge $Q_R$ is generated by a reference charge generator 9, for example a known charge metering device such as is disclosed in "Charge Transfer Devices", by C. H. Sequin and M. F. Tompsett, Academic Press (1975), at page 51, FIG. 3.13.

Each stage has its own reference charge generator to generate an identical reference charge $Q_R$ with a great degree of accuracy. The maximum reference charge $Q_R$ of the generator 9 is applied to a charge splitter 11 that splits the charge into a comparator charge packet $Q_c = Q_R - Q_R/2^n$ and a modification charge packet $Q_m = Q_R/2^n$. The operation of the charge splitter 11 will be described in detail hereafter.

It should be appreciated that, since the charge splitter 11 is operated in relation to stage 1, the variable n is equal to 1 and, therefore, $Q_R/2^n = Q_R/2$ and $Q_R - Q_R/2^n = Q_R/2$.

The comparator charge at the output of the charge splitter 11 is applied to an input 13 of the comparator 107. For rapid operation, the timing of the generation and splitting of $Q_R$ is such that the comparator charge $Q_c$ is applied to the input 13 at the same time that the source charge QS is applied to the input 5. The comparator 107 then compares the charge quantity at the input 5, corresponding to the expression on the left side of the above algorithm, and the charge quantity on the input 13, corresponding to the expression on the right side of the above algorithm, and generates a binary bit 1 at an output 15 if the charge at the input 5 is greater than or equal to the charge at the input 13. A binary 0 is generated at the output 15 if the charge at the input 5 is less than the charge at the input 13.

The comparator 107 is known in the art in a variety of circuit forms. However, in a preferred embodiment of the invention, a CCD compatible field effect transistor circuit is employed as a comparator. Such a FET comparator circuit is shown in FIG. 9 of the U.S. patent to Wang et al, U.S. Pat. No. 4,171,521, issued Oct. 16, 1979, and the comparator circuit disclosure is incorporated herein by reference.

If a binary 0 is generated at the output 15, a transfer gate 117 is operated to pass the modification charge packet Qm that is applied at an input 19 of the gate. The charge packet Qm is passed from the gate 117 to the next successive stage S2 and, at the same time, the charge residing at stage S1 is also passed to the stage S2. However, if the bit that is generated at the output 15 of the comparator 107 is a binary 1, the transfer gate 117 will not pass the charge packet Qm at its input 19 to the next successive stage S2 and, therefore, only the charge that is stored at the stage S1 will be applied to the stage S2.

The stage S2 receives the source charge from the stage S1 and, if a modification charge $Q_m$ is passed by the transfer gate 117, the modification charge is added to the source charge that is received from the stage S1. At the same time that the generator 9 and splitter 11 generate their respective charges, a reference charge generator 21 and a charge splitter 23 operate to generate associated comparator and modification charges. Thereafter, a transfer gate 125 and a comparator 127 of the stage S2 operate in a manner described for the stage S1 to generate a binary bit at an output 29 of the comparator 127. The operation of the digitizing apparatus at S2 differs from the operation of the digitizing apparatus at S1 to the extent that the indexing number n is a 2 for the stage S2 and, therefore, the charge splitter 23 is operated to generate a comparator charge packet $Q_c$ that is ¾ $Q_R$ and a modification charge packet $Q_m$ that is $Q_R/4$.

It should be understood that the comparator charge $Q_c = 3Q_R/4$ and the charge stored at the stage S2 are compared in the above-described fashion by the comparator 127 and a binary 1 or a binary 0 is generated at the output 29 of the comparator 127 in accordance with the result of the comparison. The successive stages S3, S4, S5 and S6 are operated in the same fashion to generate binary bits in accordance with a comparison between a stored charge at a stage and a corresponding comparator charge that is generated by an associated charge splitter. Of course, it should be understood that at each successive stage the indexing number n is incremented by 1 and, therefore, the charge splitter of the stage is adjusted to generate a particular associated comparator charge and modification charge. Also, since the stage S6 does not pass charge to a next successive stage, the stage S6 does not require a transfer gate or any other apparatus that is used to generate or apply the modification charge.

The pipelined operation of the apparatus of FIGS. 1.1 and 1.2 may be better understood with respect to the digitizing operation performed with respect to six input source charges Q1, Q2, Q3, Q4, Q5 and Q6. In operation, Q1 is initially applied at the pipeline input 1 and is passed to the stage S1. Thereafter, the above-described comparison operation is executed and a bit $b_1$ (Q1) is generated at the output 15 of the comparator 107. The charge at the stage S1 is then passed to the stage S2 and, at the same time, a next successive source charge Q2 is applied to the stage S1. Thereafter, the digitizing apparatus at the stage S2 generates a bit $b_2$ (Q1), corresponding to a second successive approximation for the source charge packet Q1, and the comparator 107 of the stage S1 generates a bit $b_1$ (Q2) that is the first or high order bit for the source charge Q2.

Each time the source charges in the pipeline are shifted one stage to the right, an additional source charge is applied at the input 1 and is received by the first stage S1. Thus, as the source charges are shifted in the pipeline, bits are generated at the outputs of the comparators and the bits are shifted through associated buffer shift registers 31 that are connected at the output of each comparator. The buffer shift registers 31 may be any type of digital shift registers known in the art, for example field effect transistor shift registers.

Thus, for example, when the bit $b_1$ (Q1) is generated for the source charge Q1 at the stage S1, the bit is initially passed to a first buffer stage 33. Thereafter, when the source charge Q1 is applied to the stage S2 and a corresponding bit $b_2$ (Q1) is generated, the bit $b_1$ (Q1) is shifted to a lower buffer stage 35 and the bit $b_2$ (Q1) is stored in a buffer stage 37.

As the source charge Q1 and associated modification charge components are gated down the pipeline, the high order bit $b_1$ (Q1) is shifted through the leftmost column of buffer stages and successively generated bits for the source charge Q1 are shifted through associated columns of buffer stages. When the source charge Q1 and associated modification charge components are moved to the last stage S6 of the pipeline, and a low order bit $b_6$(Q1) is generated by the last comparator, the prior bits $b_1$ (Q1), $b_2$ (Q1), $b_3$ (Q1), $b_4$ (Q1) and $b_5$ (Q1) are shifted to an end buffer stage in their respective columns so that the last buffer stage in each column contains a binary bit of the six-bit binary word for the source charge Q1. Thereafter, the source charge Q1 at the stage S6 is gated from the stage S6 and the associated six binary bits are gated from the last buffer stages of the buffer register columns to a data handling device, for example a digital computer (not shown). The charge pacekts in the pipeline are then shifted to the right and a next successive charge packet is moved into the stage S6, while associated binary bits are gated to the end buffer stages in the buffer register columns. Thus, as each charge packet is shifted into the last stage S6, a corresponding binary bit is stored at the last buffer stage of each of the columns of buffer stages. It should be understood that the apparatus of FIGS. 1.1 and 1.2 is operated continuously to receive a stream of input source charge packets and to pass the source charge packets down the pipeline and thereby generate associated binary bits for the buffer shift registers 31.

It should also be understood that, although six stages are shown for the embodiment of FIGS. 1.1 and 1.2, more or fewer stages may be used, without departing from the spirit of the invention. For each additional stage, a buffer stage may be added to each of the columns of buffer registers 31 of the preceding stages.

While the embodiment of FIGS. 1.1 and 1.2 is particularly well-suited for high speed operation, the type of comparator that is employed is subject to certain errors which can adversely affect the accuracy of analog-to-digital conversion and the maximum number of digital bits for which the converter can be designed. For the highest accuracy, an alternative embodiment of the invention is shown in the block diagram of FIGS. 2.1 and 2.2.

The embodiment of FIGS. 2.1 and 2.2 uses a second known type of field effect transistor comparator that is called a common-well comparator that has a single input for successively receiving two signals that are to be compared. A common-well comparator circuit is disclosed in an IBM Technical Disclosure Bulletin article, "High Sensitivity Charge Comparator for Sensing and Comparing Very Small Charge Packets", by L. N. Terman and Y. S. Yee, Vol. 21, No. 3 (August 1978), and the disclosure bulletin is incorporated herein by reference to facilitate an understanding of the comparator of FIGS. 2.1 and 2.2.

Referring to FIGS. 2.1 and 2.2, each stage has two charge storage sites, designated cell A and cell B. Cell A is the "common well" which is the signal input point of the common well comparator. In operation, the source charges in the pipeline are stored at cell A of each stage. In all but the first stage, an associated modification charge $Q_m$ is conditionally added to cell A to combine with the associated stored source charge. As described in connection with the embodiment of FIGS. 1.1 and 1.2, the modification charge in each stage is added when a zero binary digit is generated for the particular source charge packet by the comparator of the preceding stage.

Appropriate clock pulses are applied to the comparator circuits of FIGS. 2.1 and 2.2 to critically balance the circuits in the presence of the source charge packets residing at the cells A. During the balancing intervals the reference charge packets are generated and split into comparator $Q_c$ and modification $Q_m$ charges, in accordance with the index numbers of the particular stages, as previously described.

After the comparators have been critically balanced, the source charge packets are shifted to the respective cells B and the comparator charge packets are placed in cells A. Each of the comparators then switches to one of two states, depending upon the relative magnitudes of the source and comparator charges that are stored in the cells of the associated stage. Each stage generates a binary one if its associated source charge is greater than or equal to its comparator charge and a binary zero if the comparator charge is greater than the source charge. The binary digits may be applied to buffer shift registers as previously described.

Transfer gates 17 are conditioned by the comparator outputs so that as each source charge is shifted from an associated cell B of a stage to cell A of the next stage to begin the next conversion, a modification charge is conditionally added to the source charge. This above-described conversion sequence continues until all source charge packets are fully converted.

It should be understood that, in accordance with the invention, the cells B may be used as the input wells for the comparator and, also, the comparator charge packets may precede the source charge packets as sequential inputs of the comparators. Also, the source and modification charge packets may be merged in the cell B of a stage rather than in cell A of a subsequent stage, without departing from the invention.

FIGS. 3.1 and 3.2 illustrate a schematic plan view of two CCD stages of the pipeline system of FIGS. 2.1 and 2.2, a circuit diagram of a comparator of one of the stages and a schematic plan view of a charge splitter for one of the stages. For purposes of discussion, it is assumed that the CCD apparatus of FIGS. 3.1 and 3.2 is disposed on a substrate of P-type semi-conductor material and that n-channel CCD technology is employed to construct the apparatus of FIGS. 3.1 and 3.2 in a manner known to the art.

The stage S1 of FIGS. 3.1 and 3.2 includes a first charge storage site formed by an electrode 39, designated cell A and a second charge storage site formed by an electrode 41, designated cell B. The electrodes 39 and 41 and all other CCD electrodes of the apparatus of the invention are made of a conductive material, for example polysilicon. The electrodes 39 and 41 are supported at a first level with respect to the substrate by a thin layer of insulating material such as silicon dioxide. As is known to those skilled in the art, a potential well may be formed beneath each electrode in response to an applied positive gating signal.

A charge transfer electrode 43 is disposed at the input of the pipeline and is positioned in insulated, overlapping relation to the electrode 39 at a second level with respect to the substrate. The charge transfer electrode 43 is separated from the electrode 39 by a thin insulating layer such as silicon dioxide. Accordingly, as illustrated in the timing diagram of FIG. 4, a $\phi 0$ clock signal is applied to a field effect transistor 47 of the comparator 7, thereby raising the potential of a node H of the comparator 7 and biasing the electrode 39 to dispose the electrode to store charge. A source charge, for example QS1, may be transferred into the potential well under the electrode 39 by any of the charge transfer techniques known in the CCD art. For instance, QS1 may be transferred over a potential barrier which is induced under the electrode 43 by applying an intermediate positive voltage $V_b$ to the electrode 43. For such a charge transfer operation, $V_b$ is large enough to permit the passage of charge but it is not so large as to cause any part of the charge stored under the electrode 39 to be diverted from the potential well under the electrode 39.

Referring to the timing diagram of FIG. 4, it can be seen that at a time T1 prior to the gating of the source charge QS1 under the electrode 39, a comparator clock signal $\phi 0$ rises to a high level and the high $\phi 0$ signal is applied to the gate of a field effect transistor (FET) device 47 to cause the device to conduct and to thereby set a bias point for the electrode 39 and a charge amplifier CA, comprised of FET's 65 and 67. The $\phi 0$ clock signal also resets circuit nodes F and G of a crosscoupled charge transfer latch CTL of the comparator 7 by activating the gates of FET's 49 and 51 and thereby causing the nodes F and G to be pulled to ground. Also, at or about the time T1, a comparator clock signal $\phi 3$ rises to a high level.

The source charge packet QS1 is completely passed to the electrode 39 at a time T2 when the $\phi 0$ clock signal is high. Thereafter, the $\phi 0$ clock signal drops at a time T3 and the falling of the $\phi 0$ clock signal causes the node H of the comparator 7 and the associated conductively connected electrode 39 to become electrically floating.

A comparator clock signal $\phi 1$ rises at T3 or shortly before T3 and is applied to the gates of FET's 53 and 55 to precharge the circuit nodes F and G. It will be understood by those skilled in the art that the transients created through the FET device 47 when the $\phi 0$ clock signal drops are absorbed by the precharging action at the node F. The precharging operation of the comparator 7 ends at a time T4 when the clock signal $\phi 1$ drops. At the end of the precharging operation, the charge packet QS1 is stored in a potential well under the electrode 39, the charge amplifier CA is automatically biased and the latch CTL is critically balanced. The latch CTL is balanced in the sense that the nodes F and G are each precharged to one threshold below the respective gate voltages of the FET's 57 and 59, so that the FET's 57 and 59 are operated just sufficiently to establish a cut-off condition.

After the precharging operation of the comparator 7 is completed at the time T4, the source charge QS1 is transferred from beneath the electrode 39 by applying a gating signal G4 to a charge transfer electrode 61 that is positioned at level two with respect to the substrate in insulated, overlapping relation to the electrodes 39 and 41. The charge transfer electrode 61 is separated from the electrodes 39 and 41 by a thin insulating layer of silicon dioxide.

At approximately the same time that the gating signal G4 is applied to the electrode 61, a gating signal G5 is applied to the electrode 41, thereby forming a potential well that is deeper than the well under the electrode 39 and that has sufficient charge capacity to contain all of the charge QS1. The gating signal G4 may then be removed from the electrode 61 so that all of the charge QS1 is stored in the potential well under the electrode 41. It should be understood that when the charge QS1 is gated from the electrode 39, a positive transient voltage that is proportional to the charge QS1 appears at the input node H of the comparator 7.

Prior to the time that QS1 is stored under the electrode 41, a reference charge packet $Q_R$ is generated by the reference generator 9 and is shifted through the charge splitter 11 when appropriate CCD clock signals are applied to the electrodes of the charge splitter, as will be hereinafter described. $Q_R$ is divided into two fractional charges as it progresses through the charge splitter 11. One resultant fractional charge, the modification charge $Q_m$, is stored under an electrode region 50a and the other fractional charge, the comparator charge $Q_c$, is stored under an electrode region 50b. The fractional charges are stored under the respective regions 50a and 50b in response to a gating signal G6. As explained above, the magnitude of the comparator charge packet $Q_c$ is defined as $Q_R - Q_R/2^n$, or $Q_R/2$ for the stage S1 and the magnitude of the modification charge packet $Q_m$ is defined as $Q_R/2^n$, or $Q_R/2$ for the stage S1. During the same time interval that the above-mentioned reference charge packet $Q_R$ is clocked through the charge splitter 11, a second reference charge packet $Q_R$ is generated by the reference generator 9 and is stored in a potential well under a reference generator output electrode 46 for use in the next operational cycle of the analog-to-digital converter.

When QS1 is stored under the electrode 41 and the gate signal G4 of the charge transfer electrode 61 is removed, a comparator charge packet $Q_c$ is passed from beneath the level one electrode region 50b of the charge splitter 11 to a potential well under the electrode 39 by means of a charge transfer electrode 63 that is positioned at level two with respect to the substrate and that is supported in insulated, overlapping relation to the electrode region 50b and the electrode 39 by an intermediate layer of silicon dioxide.

The comparator charge packet $Q_c$ is moved into position beneath the electrode 39 by terminating the gating signal G6 of the electrode 50 so that the packet $Q_c$ passes across a barrier potential well under the electrode 63 to a deeper potential well under the electrode 39. The potential barrier under the electrode 63 is created by applying thereto an intermediate fixed voltage $V_b$.

When the comparator charge packet $Q_c$ is stored under the electrode 39, a negative voltage transient corresponding to the magnitude of the charge packet $Q_c$ appears at the node H of the comparator 7 in opposition to the positive transient voltage that was left by the charge QS1. The positive and negative voltages combine to produce a net voltage change at the node H which is proportional to the difference between QS1 and $Q_c$.

FET devices 65 and 67 of the charge amplifier CA operate as a source follower with respect to the potential at the node H, thereby applying an attenuated difference signal at the output of the charge amplifier CA. The attenuated difference signal is AC coupled to the node F through an intermediate capacitor C1. It should be appreciated that, although the difference signal voltage at node F is less than the difference signal voltage at node H, charge amplification is achieved because the capacitance of node F is larger than the capacitance of node H. Also, the voltage at node G remains at the level that was set during the precharging action.

At a time T5 after the attenuated difference signal is coupled to node F, a positive ramp clock signal $\phi_2$ is applied to amplify the charge signal at node F and to thereby develop an amplified difference signal $V_{IJ}$ between circuit nodes I and J. It should be understood that a positive signal at node F will result in a positive voltage $V_{IJ}$ at node I with respect to node J, and a negative signal at node F will result in a negative voltage $V_{IJ}$ on node I with respect to node J. Accordingly, if the charge QS1 is greater than the charge $Q_c$, the node F will be positive with respect to node J. Likewise, if QS1 is less than $Q_c$, the node F will be negative and the corresponding node I will be negative with respect to node J.

During the time period from T1 to T5, latch FET's 40 and 42 are maintained in an inactive stage in response to the high voltage level of a fourth clock signal $\phi_3$. However, at a time T6 the signal $\phi_3$ is dropped to activate the FET's 40 and 42 and at a slightly delayed time T7 the clock signal $\phi_1$ is raised to supply latch current to the FET's 40 and 42. Thereafter, the cross-coupled FET's 40 and 42 are operated in one of two stable states, depending upon the polarity of the voltage $V_{IJ}$ across the nodes I and J. If the voltage at the node I is more positive than the voltage at the node J just prior to the activation of the FET's 40 and 42, the FET 42 will be latched in a conducting state and the FET 40 will be latched in a non-conducting state to maintain the relative polarities of the nodes I and J for as long as the low $\phi_3$ signal and high $\phi_1$ signal are applied. Likewise, if the node J is more positive than the node I, the FET 40 will be latched in a conducting state and the FET 42 will be latched in a non-conducting state.

It should be understood that the polarity of the voltage across the nodes I and J will indicate whether the source charge packet QS1 is greater than or less than the comparator charge packet $Q_c$ and will, therefore, determine the identify of the binary bit for the comparator. Thus, a binary 1 is defined if the voltage at the node I is more positive than the voltage at the node J, since a positive voltage at the node I indicates that QS1 is greater than $Q_c$. Likewise, a more positive voltage at the node J defines a binary 0 for the comparator 7.

A binary output line 69 is conductively connected to the node I and may be passed to the first stage of a column of buffer shift registers, as shown in FIG. 2.1. A high voltage on the line 69 designates a binary 1 and a lower voltage designates a binary 0.

When the fall of G6 causes the comparator charge packet $Q_c$ to be transferred from the electrode 50b to the electrode 39 across a barrier potential under the electrode 63, the fall of G6 also causes a modification charge packet $Q_m$ to be transferred from the electrode 50a to a potential well that is induced under a storage electrode 77 of the transfer gate 17 by a gating signal G3. $Q_m$ is transferred across a barrier potential that is induced under the electrode 71 by an intermediate fixed voltage $V_b$ that is applied to the electrode 71. It should be understood that the electrode 71 is supported at level two in insulated, overlapping relation to the electrodes 50a and 77 and is separated from the electrodes by a thin layer of silicon dioxide.

Two alternative paths are provided for the transfer of $Q_m$ from the electrode 77. The first path is defined by a drain gating electrode 75 which is supported on a second level in insulated, overlapping relationship to the electrode 77 and in close proximity to the edge of a diffused N+ drain region 79 that is disposed in the silicon substrate. The electrode 75 is conductively coupled to the output of a NOR gate 73, for example a FET type NOR gate, of the transfer gate 17 and the drain region 79 is connected to a supply voltage +V that creates a potential well at the drain region and provides for the removal of charge packets that are placed in the drain region.

The second path for the charge packet $Q_m$ is defined by an electrode 76 that is supported on a second level in insulated, overlapping relationship to the electrode 77 and to an electrode 85 that is the cell A electrode of the stage S2. The electrode 76 is connected to an intermediate voltage level $V_b$ that induces a potential barrier well under the electrode 76.

In operation, the charge packet $Q_m$ that is stored under the electrode 77 of the transfer gate 17 for stage S1 is passed over the potential barrier of the electrode 76 for charge addition under the cell A electrode 85 of the next stage S2 if a binary 0 is generated by the comparator 7 and the packet $Q_m$ is dispersed in the drain region 79 if a binary 1 is generated by the comparator 7. The described operation is consistent with the successive approximation algorithm of the invention, since the modification charge term $(\overline{b_x}) \cdot (Q_R/2^x)$ of the algorithm is only added if the complement or inverse of the associated bit $b_x$ is a 1, that is, when the bit $b_x$ is a 0.

Thus, after the charge $Q_m$ is stored under the electrode 77 and the circuitry of the comparator 7 is operated to establish the voltage potentials at the nodes I and J that define the binary bit of the comparator, a low voltage gating signal G7 is applied to an input of the NOR gate 73 so that the output of the NOR gate is controlled by the voltage state of the node J. A positive voltage is provided at the output of the NOR gate and is applied to the drain gating electrode 75 if the voltage at the node J is low relative to the voltage at the node I, that is if a binary 1 is generated at the output 69 of the comparator 7.

If a binary 0 is generated at the output 69 of the comparator 7, the corresponding high voltage at the node J forces the output of the NOR gate 73 low.

After the low G7 signal and the node J voltage for a binary 0 output of the comparator 7 force the output of the NOR gate low, the G3 gating signal is dropped in voltage so that the entire modification charge packet $Q_m$ under the electrode 77 is transferred over the potential barrier beneath the electrode 76 and into a potential well provided under the cell A electrode 85 of the next stage S2. The low output of the NOR gate ensures that the voltage on the gating electrode 75 is too low to induce a potential well under the electrode 75.

When a binary 1 is generated at the output 69 of the comparator 7 of FIG. 3.1, the corresponding low voltage at the node J and the low voltage of the gating signal G7 force the output of the NOR 73 gate high so that a potential well is formed under the drain gating electrode 75. The potential well under the electrode 75 causes the modification charge packet $Q_m$ to be conducted from the electrode 77 to dissipate in the +V power supply that is connected to the drain region 79. Thereafter, the voltage of the gating signal G3 is dropped. It should be understood that, in accordance with the invention, all of the charge $Q_m$ is passed to the drain region 79 before the gating signal G3 is dropped, in order to avoid an erroneous distribution of charge to the electrode 85 when the comparator registers a binary 1.

It will be understood by those skilled in the art that various types of logic gates, other than the suggested NOR gate, may be utilized to achieve the objects of the invention, if the gates are operated to provide appropriate signal polarities to carry out the described logic functions of the invention. Moreover, it should be understood that, since the NOR gate is employed to defer, the diversion of a charge packet $Q_m$ until a comparator output is valid, the NOR gate may be replaced by CCD logic gates having two or more successive electrodes disposed to replace either the electrode 75 or the electrode 76 and controlled by an output I or J of the comparator and an associated clock pulse in place of the gating signal G7.

At the same time that the low voltage gating signal G7 is applied to the NOR gate 73, a gating signal G8 is applied to a second drain gating electrode 81 which is supported on a second level in insulated, overlapping relationship with the electrode 39 and in close proximity with the edge of a second diffused drain region 83 which is connected to a positive potential +V. The positive potential may be derived from the same power supply that is connected to the diffused drain region 79. Moreover, the two diffused drain regions 79 and 83 may be constructed in common with one another, without departing from the invention.

When the drain electrode 81 is energized by the gate signal G8, the comparator charge packet $Q_c$ that is stored at the electrode 39 is drained through the electrode 81 to the potential well of the diffused region 83 in the manner described for the diffused region 79, and is conducted from the region 83 to the +V power supply. After the charge $Q_c$ is passed to the power supply, the G8 signal is terminated to isolate the drain 83 from the electrode 39.

At the same time that the gating signal G3 drops in voltage, a gating signal G5 also drops in voltage to cause the source charge that is stored under the cell B electrode 41 to be transferred over a potential barrier beneath an electrode 84 into a potential well under the electrode 85. The electrode 84 is supported at level two with respect to the substrate in insulated, overlapping relation to the electrodes 41 and 85. Also, the voltage $V_b$ is applied to the electrode 84 to form the above-mentioned potential barrier.

If the bit that is generated at the output line 69 is a binary 0, the modification charge packet $Q_m$ is moved to the potential well under the electrode 85 in response to a falling G3 signal, as described above, and is combined with the source charge packet that is moved under the electrode 85 in response to a simultaneously falling G5 signal, to produce a source charge packet for the stage S2. Also, after the cell A electrode 39 is cleared by the activation and subsequent deactivation of the G8 signal, a new source charge packet QS2 is transferred into the potential well under the electrode 39 of the stage S1 and the packet QS1 is passed down the pipeline in the manner described for the QS source charge. Of course, additional source charges are sequentially applied to the electrode 39 for movement down the pipeline and subsequent digitization.

At the end of an operational cycle of the stage S1, a binary bit $b_1(QS1)$ is generated at the output line 69, the electrode 39 has stored the source charge packet QS1 and the electrode 85 has stored the source charge packet QS1 and the charge $Q_m$, if a binary 0 was generated for $b_1(QS1)$. Thereafter, the above-described gating signals and clock pulses are applied at the stage S2 to generate a next lower order binary bit $b_2(QS1)$ by the indicated successive approximation method of the invention. At the time that the signals are applied at the stage S2, the signals are also applied at the stage S1 so that the stage S1 apparatus generates a first high order binary bit $b_1(QS2)$ for the charge packet QS2, in the above-described manner.

Although only the stages S1 and S2 of the six-bit register of FIGS. 2.1 and 2.2 are shown in FIGS. 3.1 and 3.2, it should be appreciated that the stages S3–S5 have the apparatus that is shown for the stage S1 of FIG. 3.1 and the apparatus is operated in the manner described for FIG. 3.1. The last stage S6 does not require all of the apparatus that is shown for stage S1, since the last stage does not pass forward a source charge or a modification charge $Q_m$. Accordingly, the last stage S6 does not require a transfer gate or a cell B electrode. In place of the transfer gate and the cell B electrode, stage S6 may be provided with diffused drain regions to drain off modification and source charge packets in the manner described above.

It should be appreciated that the stages differ in that at each stage the comparator charge packet $Q_c$ and the modification charge packet $Q_m$ represent different respective fractions of the total reference charge $Q_R$, as indicated in FIGS. 2.1 and 2.2.

FIGS. 5.1 and 5.2 illustrate a schematic plan view of the first two stages of the pipeline analog-to-digital converter system of FIGS. 1.1 and 1.2, which is a preferred embodiment in the instance that speed of operation is the primary requirement. The embodiment of FIGS. 1.1 and 1.2 differs from that of FIGS. 2.1 and 2.2 in that the sorce and comparator charge packets of FIGS. 1.1 and 1.2 are simultaneously presented to a comparator, wherein in FIGS. 2.1 and 2.2 the source and comparator charge packets are presented sequentially to a comparator. However, it should be understood that the analog-to-digital conversion algorithm is identical for the embodiment of FIGS. 1.1 and 1.2 and the embodiment of FIGS. 2.1 and 2.2.

In the embodiment of FIGS. 5.1 and 5.2, a simple FET comparator 107 is provided in order to enhance the speed of operation. Comparators of this simplified type are known in the art and, as indicated above, such a comparator is shown at FIG. 9 of the U.S. patent to C. S. Wang et al, U.S. Pat. No. 4,171,521.

In the charge comparator 107 of the embodiment of FIGS. 5.1 and 5.2 FET transistors 147 and 247 and charge amplifiers CA1 and CA2 are provided to ensure that the initial voltages for electrodes 139 and 239 are properly set and to isolate the electrodes 139 and 239 from the voltage changes at the output nodes of the comparator 107. It should be appreciated that the charge amplifiers CA1 and CA2 of FIG. 5.1 are the same as the charge amplifier CA of FIG. 3.1 and the FET's 147 and 247 of FIG. 5.1 are the same as the FET 47 of FIG. 3.1.

Figure 6:
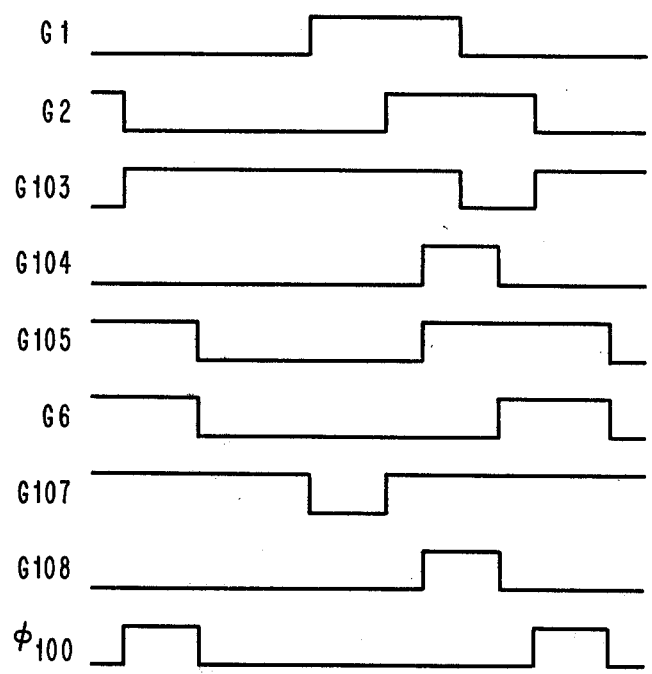
FIG. 6 illustrates a timing diagram of control signals for the converter of FIGS. 5.1 and 5.2.

FIG. 6 illustrates a timing diagram for the circuit of FIGS. 5.1 and 5.2. As shown in FIG. 6, a $\phi 100$ clock signal is applied to the gate electrodes of the FET's 147 and 247 to raise the potential of nodes M and N and to thereby bias the electrodes 139 and 239 of stage S1 to receive charge. $\phi 100$ is also applied to the gate electrode of a FET 149 of the comparator 107 to make the FET 149 conduct and thereby balance a cross-coupled latch comprised of FET's 140, 142, 153 and 155, so that the potentials at the input/output nodes O and P of the latch are the same and FET's 140 and 142 are both somewhat conducting.

Prior to the termination of the $\phi 100$ signal, the reference generator 9 operates to generate a reference charge packet $Q_R$ and the charge splitter 11 operates to divide $Q_R$ into the two charge packets $Q_c$ and $Q_m$ that are defined as for the embodiment of FIGS. 3.1 and 3.2. Immediately prior to the termination of the $\phi 100$ clock signal, $Q_c$ resides in a potential well under the 50b electrode region of the charge splitter 11 and $Q_m$ resides in a potential well under the 50a region. The potential wells under the regions 50a and 50b are induced by the high voltage state of the G6 gating signal as described above for FIGS. 3.1 and 3.2.

The voltage of the G6 gating signal drops at the same time or shortly after the $\phi 100$ clock signal is terminated. The fall G6 gating signal causes the $Q_c$ charge packet to be transferred over a potential barrier under an electrode 163 and into a potential well under a storage electrode 239. The falling G6 signal also causes the $Q_m$ charge packet to pass over a potential well under an electrode 171 and into a potential well that is formed under an electrode 177 of a transfer gate 117 by the high voltage stage of a gating signal G103. The potential barriers under the electrodes 163 and 171 are created in response to a fixed intermediate voltage $V_b$ that is applied to the electrodes, as indicated for the embodiment of FIGS. 3.1 and 3.2.

At about the time that the G6 signal drops, an input source charge packet QS is injected to pass over a potential barrier beneath an input electrode 143 and into a potential well that is created under a storage electrode 139 by the operation of the comparator 107. The injection of the input charge packet may be achieved, for example, by spilling the input charge from a diminishing potential well that may be created in response to a diminishing injection gating voltage.

The comparator 107 of FIG. 5.1 causes the electrodes 139 and 239 to float when the $\phi 100$ clock signal is terminated, in the manner described for the electrode 39 of FIG. 3.1. Thus, the voltage levels of the electrodes 139 and 239 are reduced in response to the above-indicated injection charges $Q_c$ and QS and corresponding negative voltage transients are produced at the nodes M and N. The voltage transients are attenuated by the respective charge amplifiers CA1 and CA2 and are capacitively coupled to nodes O and P of the comparator.

The amplitudes of the negative transients that are applied to the nodes O and P are proportional to the respective amplitudes of the charge packets QS and $Q_c$. A transient voltage difference is then registered between the nodes O and P and the voltage difference is proportional to the difference in magnitude between the comparator charge $Q_c$ and the source charge QS. If QS is larger than the transient $Q_c$, the transient voltage at the node P is greater than the transient voltage at the node O. Conversely, if $Q_c$ is larger than QS, the voltage at the node O is greater than the voltage at the node P.

It should be understood that a transistor 149 will stop conducting when the $\phi 100$ signal is terminated and, therefore, the transient voltage difference between the nodes O and P will be amplified by the cross coupled latch and the latch will be locked into one of its two stable stages, in accordance with the polarity of the transient voltage difference. Thus, if QS is larger than $Q_c$, the node P will be at a higher voltage level than the node O and a binary 1 will be defined at an output line 15 to designate the most significant bit of the associated source charge packet QS. Likewise, if the node O has a higher voltage level than the node P, a binary 0 will be registered at the output line 15 for the most significant bit of the source charge packet QS.

As shown in FIG. 5.1, the node O is conductively connected to a first input of a NOR gate 173 of the transfer gate 117 and the second input of the NOR gate is connected to receive a G107 gating signal. As indicated for the embodiment of FIG. 3.1, the gating signal G107 drops when the output state of the comparator 107 is established, thereby enabling the output of the NOR gate to respond to the controlling first input. If a binary 1 is registered at the line 15 of the comparator, a high output is forced at the NOR gate to turn on a drain gating electrode 175 and to thereby cause the modification charge $Q_m$ to move from the potential well under the electrode 177 to a diffused drain 179, where the charge is dissipated in a +V voltage supply. If a binary 0 is registered, the modification charge packet $Q_m$ is not drained from the 177 electrode and, subsequently, the gating signal G107 is raised and thereby terminated.

After the termination of the G107 signal, the voltage of a G108 gating signal is momentarily raised to drain the comparison charge packet $Q_c$ from the potential well under the storage electrode 239 to a diffused drain region 183 and associated +V power supply.

At the same time that the voltage of the signal G108 is raised, the voltage of the gating signals G104 and G105 are also raised so that ths source charge QS is passed from the electrode 139 to a potential well under a temporary storage electrode 141. It should be understood that the well under the electrode 141 is deeper than the well under the electrode 139 and, therefore, all of the charge packet QS will move to the well under the electrode 141. As shown in FIG. 6, the G104 gating signal terminates at the same time as the G108 gating signal.

The increased voltage of the gating signals G104 and G105 also causes at least a portion of the modification charge packet $Q_m$ to be transferred from under the electrode 177 to a potential well under a temporary storage electrode 241. After the gating signal G104 is activated, the gating signal G103 is terminated so that the charge $Q_m$ is entirely removed from beneath the electrode 177.

In the course of the operational cycle heretofore described, the reference generator 9 generates the reference charge packet that is to be used in the next operational cycle, and the charge splitter 11 divides the charge into a new comparator charge packet $Q_c$ and a new modification charge packet $Q_m$ which are respectively stored in potential wells under the electrodes 50b and 50a. The potential wells of the electrodes 50a and 50b are formed by the rise of the gating signal G6 at about the time that the gating signal G108 falls.

In preparation for the next operational cycle of the apparatus of FIGS. 5.1 and 5.2, the voltage is raised for the G103 and $\phi 100$ signals so that potential wells are formed under the electrodes 139, 239 and 177 for receiving a new source charge QS1, comparator charge $Q_c$ and modification charge $Q_m$. The new cycle begins when the state of the comparator 107 is set for the new source charge QS1 and associated comparator charge $Q_c$ by the termination of the $\phi 100$ clock signal and the falling G105 signal causes the previous source charge QS and any associated modification charge $Q_m$ to be transferred over the $V_b$ potential barriers of electrodes 184 and 176 and combined under an electrode 185 of the next stage S2. It should be understood that the apparatus of FIGS. 1.1, 1.2, 5.1 and 5.2 continues to operate in the described cyclic fashion to move successive source charges down a pipeline of digitization stages and to thereby generate successive lower order digital bits for each source charge.

A charge splitter 11 for the stage S1 is shown in FIGS. 3.1 and 5.1. The charge splitter operates by transferring the reference charge packet $Q_R$ of a reference generator 9 from a single potential well formed under an electrode by a gating signal G1, to two receiving potential wells of equal area. The receiving potential wells are formed under the electrode regions 50a and 50b in response to a G6 gating signal. Thus, half of the reference charge $Q_R$ is transferred beneath the 50a region as the modification charge packet $Q_m$ and half of $Q_R$ is transferred beneath the 50b region as the comparator charge packet $Q_c$. Intermediate electrodes 48a and 48b are connected to a gating signal G2 and are provided to improve the accuracy of the splitter.

In subsequent stages of an analog-to-digital converter, charge splitters much be provided to split the reference charge $Q_R$ in accordance with different ratios. For example, the charge splitter for the stage S2 must generate a modification charge packet $Q_m$ that is $Q_R/4$ and a comparator charge packet $Q_c$ that is $3Q_R/4$, for a ratio for $Q_m$ to $Q_c$ of one to three. Similarly, subsequent stages must have splitters that provide successively greater charge ratios, in accordance with the successive approximation algorithm of the invention.

A charge splitter may split a $Q_R$ input charge into the desired charge ratio components by utilizing two splitting electrodes that have an area ratio that corresponds to the desired charge splitting ratio. However, as a practical matter, such charge splitting electrodes may only be effectively employed for converter stages that require a relatively small component charge ratio, since, as the ratio increases, the accuracy of the charge splitting tends to decrease.

More particularly, the size of the larger of the two splitting electrodes is limited since the charge splitter itself must necessarily remain relatively small and, therefore, as the desired ratio increases, the size of the smaller of the two splitting electrodes must necessarily decrease. However, as the smaller electrode decreases in size, expected random and systematic photolithographic errors in the area of the electrode cause increasing errors in the area ratio, thereby reducing the accuracy of the charge splitting ratio and the associated accuracy of the analog-to-digital conversion process.

Figure 7:
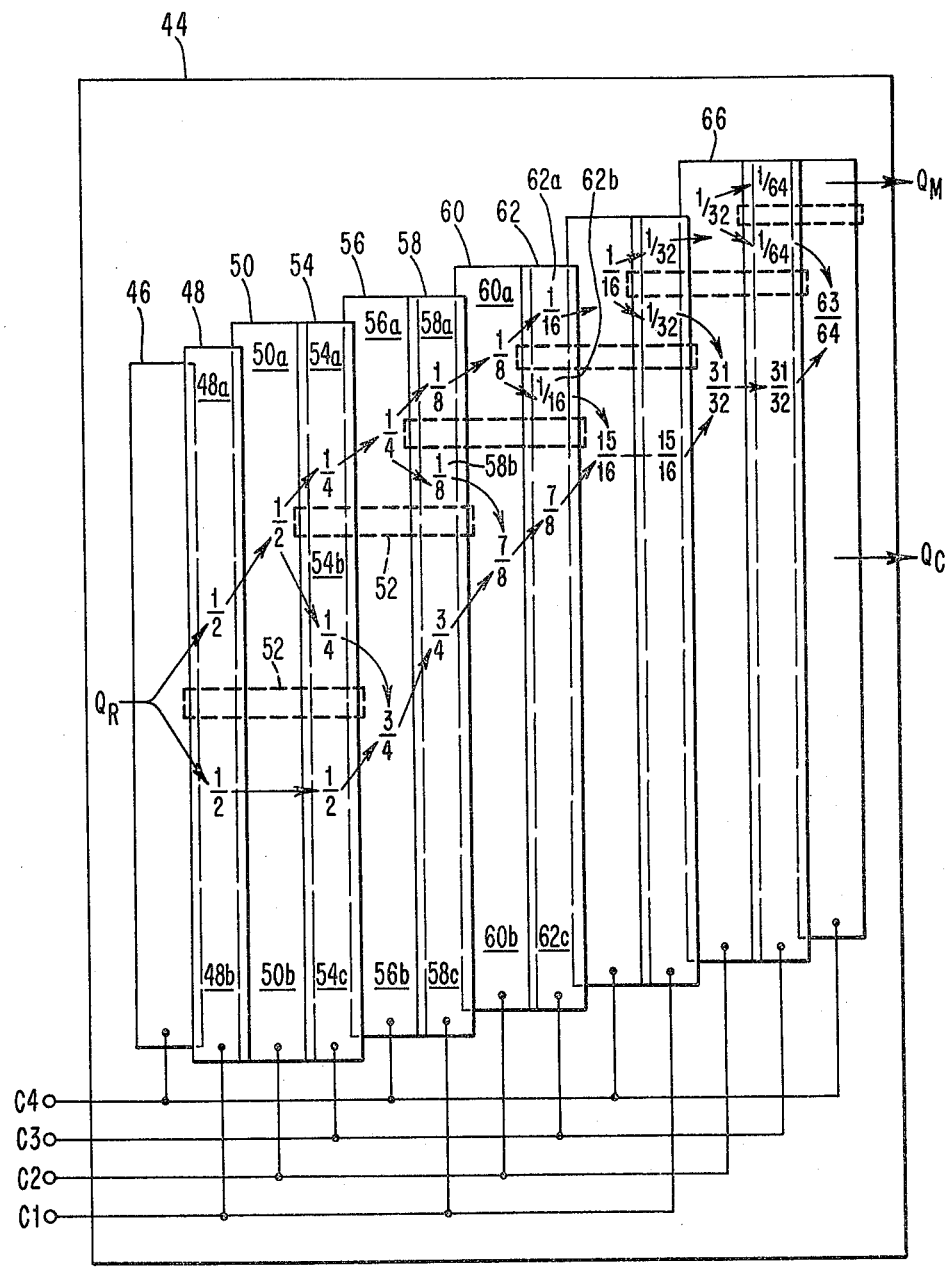
FIG. 7 illustrates a plan view of the electrodes of a more precise charge splitter that may operate at stage six of an analog-to-digital converter, in accordance with the invention.

FIG. 7 illustrates a plan view of the charge splitting electrodes of a pipelined charge splitter that may operate at stage six S6 of the analog-to-digital converter of the invention to produce the required 1 to 63 charge ratio. The charge splitter of FIG. 7 may be employed to minimize the above-identified sources of error and to extend the applicability of the analog-to-digital converter of the invention to high precision applications that require relatively large charge ratios. The charge splitter of FIG. 7 operates by successively halving and recombining portions of charge.

Since each successive division of the charge packets is made according to a ratio of one-to-one, the influence of systematic lithographic errors is eliminated and also, the influence of random lithographic errors is greatly reduced. The charge splitter of FIG. 7 is operated in a pipelined fashion in order to ensure that the modification and comparator charge packets are supplied to later stages of a converter at the same rate that the packets are supplied to earlier stages. Thus, the charge splitter does not adversely affect the speed of the converter of the invention. Although the operation of the charge splitter of the invention is hereafter described for the sixth stage S6 of the analog-to-digital ,onverter of FIGS. 1.1, 1.2, 2.1 and 2.2, it should be appreciated that the splitter may operate in the manner described for any stage of a converter.

As shown in FIG. 7, a plurality of electrodes (shown in a vertical orientation in the figure) are arranged so that successive adjacent electrodes alternate between a first and a second level with respect to a substrate 44 and adjacent edges of the electrodes overlap. The electrodes are comprised of thin strips of conductive material such as doped polysilicon and the strips are insulated from one another and from the substrate by thin insulating layers of, for example, silicon dioxide. Each electrode covers isolation regions 52 comprised of, for example, relatively thick layers of silicon dioxide with underlying channel-stopping p-type implants in the surface of the silicon substrate.

The isolation regions 52 define charge storage areas for each electrode. A potential well may be formed in a charge storage area and a packet of charge may be held in the well when the electrode is energized by one of the gating signals C1-C4. Thus, for example, potential wells are formed in the areas 54a, 54b and 54c of the electrode 54 in response to an applied C3 gating signal. Of course, a single gating signal energizes an entire vertical electrode to form a potential well at each storage area of the electrode.

The operation of the charge splitter of FIG. 7 will hereafter be explained by tracing a single reference charge packet $Q_R$ that is introduced into a potential well under the electrode 46 and that propagates from the left to the right in response to applied clocking signals C1-C4. By way of example, the operation of the charge splitter of FIG. 7 will be explained with respect to a four-phase clocking scheme, although other known clocking schemes may be employed without departing from the invention. In practice, the clock signals that are used in the apparatus that generates source charges QS may be used to operate the charge splitter of the invention.

In operation, a reference charge packet $Q_R$ is applied to the charge splitter from an associated reference generator and the electrode 46 is energized by a clock signal C4 to create a potential well under the electrode 46 that receives the charge $Q_R$. A gating signal C1 is then applied to the electrode 48 to form a potential well in an area 48a under the electrode 48 and a corresponding potential well in an area 48b under the electrode 48. The potential wells are equal in area and are positioned to receive the charge $Q_R$ from the electrode 46 in equal proportion. Thereafter, the signal C4 is terminated and a $Q_R/2$ charge is moved into the wells of the regions 48a and 48b. The gating signal C2 is then applied to energize the electrode 50 to receive the $Q_R/2$ charges from the electrode 48 and the signal C1 is terminated so that all of the charge is transferred from the electrode 48 to the regions 50a and 50b of the electrode 50.

The C3 gating signal is thereafter applied to energize the electrode 54 to form potential wells under the electrode in the regions 54a, 54b and 54c and the C2 signal is terminated. Thus, the $Q_R/2$ charge at the region 50a is equally divided between regions 54a and 54b of the energized electrode 54 so that a charge corresponding to $Q_R/4$ is stored in a potential well in each region. Also, the potential well in the region 54c receives the $Q_R/2$ charge from the region 50b. The electrode 56 is then energized by the C4 signal and the signal C3 is terminated so that the $Q_R/4$ charge from the region 54b and the $Q_R/2$ charge from the region 54c recombine in a well in the region 56b to form a total charge $3Q_R/4$. Also, the potential well in the region 56a receives the charge $Q_R/4$ from the region 54a.

The signal C1 is thereafter applied to energize the electrode 58 and the signal C4 is terminated so that a potential well at the region 58c receives a $3Q/4$ charge packet and the potential well in each of the regions 58a and 58b receives a $Q_R/8$ charge packet. The electrode 60 is then energized by the C2 signal and the C1 signal is terminated so that a $7Q_R/8$ charge is stored in the potential well in the region 60b and a $Q_R/8$ charge is stored in the potential well of the region 60a. Succeeding electrodes of the charge splitter of FIG. 7 are energized by the gating signals C1-C4 in the above-described fashion to form charge packets having the indicated fractions.

It should be understood that a serial stream of reference charge packets $Q_R$ is applied to the charge splitter and corresponding divided charges are continuously gated through the splitter to ensure that the required $Q_m$ and $Q_c$ fractional reference charges are available for gating to an associated stage of the converter whenever a new source charge is gated into the stage. The charge splitter is operated in a pipelined fashion so that a new $Q_R$ charge packet enters the splitter before the previous $Q_R$ charge packet has passed through the splitter, provided that the charges are separated by a sufficient number of electrodes to ensure their isolation. Accordingly, in the four-phase example of FIG. 7, a group of fractional charge packets derived from a reference charge packet may at any instant of time be located in each group of four adjacent electrodes simultaneously.

If the splitter of FIG. 7 is employed for the sixth stage S6 of a converter, the charges $Q_c$ and $Q_m$ may be gated from the rightmost electrode. Splitters for earlier stages use correspondingly fewer stages to generate the required fractions of $Q_R$. Thus, for example, the splitter for stage S1 ends at the electrode 50 and is identical with the simple splitter of FIGS. 3.1 and 5.1. The splitter for stage S2 ends at the electrode 56, where the charges $Q_c=3Q_R/4$ and $Q_m=Q_R/4$ are provided. In general, each of the charge splitters for the stages S1–S5 terminates at the particular electrode that generates the required fractional $Q_c$ and $Q_m$ charges for the associated stage. If more than six stages are required for an analog-to-digital converter, more complex splitters may be constructed by adding additional electrodes to the charge splitter of FIG. 7 to produce the required additional $Q_c$ and $Q_m$ fractional charges.

For any but a two phase clocking system the clock phase at which the splitter terminates is not the same for each stage. In order that the splitters deliver fractional charges to each stage at the same clock phase, additional electrodes must be provided for the splitters of appropriate stages to delay the charge outputs without changing them, as is known in the art. In the four phase example of FIG. 7, two additional electrodes may be added at the outputs of the splitters of stages S1, S3 and S5 so that their outputs may appear at an electrode that is connected to the clock phase signal C4.

In designing a charge splitter of the type of FIG. 7, it is desirable for both economy of layout and accuracy that the potential wells of the electrodes be as full of charge as practicable. Thus, as the charge packets are divided and thereby reduced in size, the areas of the associated potential wells are correspondingly reduced. Thus, in FIG. 7, it may be assumed that the electrode 46 is just large enough to contain the charge $Q_R$ and similarly, to a good approximation, the other charge splitting electrodes through electrode 66 are just large enough to hold their respective charges. However, known electrode producing technology limits the extent to which the area of a potential well may be reduced and, therefore, in the splitter of FIG. 7, the potential wells that hold the charges $Q_R/32$ and $Q_R/64$ are the same size. Thus, the potential wells that hold the $Q_R/64$ charge are not as full of charge as are the wells of the other electrodes of the charge splitter. Of course, it should be understood that the limitation on the area of potential wells does not in itself limit the degree to which a charge $Q_R$ may be divided.

Some CCD electrodes are shown in the schematic diagrams of FIGS. 3.1, 3.2, 5.1 and 5.2 as relatively long in the direction of charge propagation. It is known in the art that such long electrodes slow down the transfer of charge and, therefore, should be avoided, since the slower movement of charge may introduce timing or synchronization problems in the CCD device. Also, the comparators 7 and 107 typically occupy more space on the silicon substrate than a stage such as S1 when the stage is designed with short electrodes for fast charge transfer. Similar dimensional problems may arise in other parts of the design, for instance in the charge transfer path between the transfer gate 17 and the stage S2.

The timing problems associated with the dimensional variations in the electrodes may be solved in the present invention by adding CCD delay stages at appropriate points at each stage of the pipeline. The delay stages may each include a series of CCD electrodes that are operated in a known manner by CCD clock signals, for example the clock signals that are used in an associated source charge generator and the associated pipelined charge splitter. Each stage of the CCD delay may simultaneously store a charge packet, so that the delay stages are operated in a pipelined fashion. Thus, the rate at which source charge packets enter the apparatus and the rate at which the digital values of the charges are determined by the apparatus is not changed by the introduction of the delay stages. FIGS. 8.1 and 8.2 illustrate a block diagram of an analog-to-digital converter of the type of FIGS. 2.1 and 2.2 that has two delay stages D between the stages S1 and S2 and two delay stages D between the transfer gate 17 and the stage S2. Correspondingly, the number of stages of the buffer shift register 31 may be increased in all of the stages but the last stage S6.

Although a preferred embodiment of the invention has been described with respect to a two-level overlapping electrode CCD structure, it should be appreciated that other known CCD structures may be utilized, without departing from the spirit of the invention. Also, different types of charge comparators may be employed to provide the comparison function for the apparatus of the invention and different gating and clocking sequences may be utilized to operate such comparators.

It should now be appreciated that the pipelined apparatus of the invention is well-suited for operation with fast-output analog charge transfer devices such as image scanners, signal processors and multi-level stores. In addition, the apparatus of the invention is compact and, therefore, may be included on the same chip as the apparatus of an associated charge-generating device. The compactness of the apparatus of the invention is due, in part, to the use of simple charge splitters that quickly and accurately generate fixed reference charges ($Q_c$ and $Q_m$) at each stage of the converter. The reference charges are not dependent upon the binary data that is generated at preceding stages and, therefore, complicated feedback circuitry and associated feedback lines are not required for the apparatus of the invention. Thus, the converter of the invention takes up less space and operates more efficiently than prior art analog-to-digital converters. Also, charge packets are not subtracted in the digitizing apparatus of the invention since, as a practical matter, such subtraction is difficult in a charge transfer environment. Moreover, the invention makes use of a single pipelined CCD shift register to perform the successive approximation functions, thereby further reducing the necessary digitizing hardware.

The operation of the analog-to-digital converter of the invention may be improved by minimizing the digitization error that is inherent in the successive approximation process. It will be appreciated by those skilled in the art that the output of a successive approximation analog-to-digital converter is virtually always different than the true value of the input, by a maximum error of the least significant bit. In practice, it is known to minimize the error by shifting the input/output characteristic of the converter. Thus, in general, the error may be minimized by changing the reference charge $Q_R$ to adjust for the error or changing the input charges QS to adjust for the error or changing the output. Alternatively, any combination of the above factors may be changed to minimize the error.

In practice, the error may be minimized by lowering each quantization threshold, without changing the value of each quantization step. This may be accomplished by using a new reference charge $(Q_R)\cdot(1-\frac{1}{2}^{p+1})$, and by modifying the charge splitters to provide a comparator charge packet $(Q_R)\cdot(1-\frac{1}{2}^n-\frac{1}{2}^{p+1})$, and the usual modification charge packet $Q_R/2^n$, where p is the number of bits of precision of the converter.

An alternative means of reducing the digitization error is to increase each charge packet that is introduced into the pipeline by adding a charge $Q_R/2^{p+1}$ to the packet before it enters the pipeline. It should be noted, however, that the range of the input charge will be reduced in comparison to the maximum reference charge by the amount of the charge that is added.

Although the above two methods of reducing the digitization error are feasible, the methods will result in a digitization that is relatively coarse in comparison to the dynamic range of the analog-to-digital converter.

Accordingly, it is preferred to reduce the digitization error of the converter by adding one-half of the least significant bit to all of the digital outputs of the converter. In practice, the addition is achieved by adding a binary one at the least significant bit position of each digital output word of the converter. The digitized representation thus obtained will provide an adequate digitization correction for the converter, without changing the dynamic range.

Further digitization errors result if the signal that is to be converted contains an erroneous charge portion, generally designated a "fat zero". For example, a desired input signal QS may, in practice, appear at the input of the converter as a somewhat larger signal QS+Q0, where Q0 is the fat-zero component. The fat-zero component of a source charge may be removed by a known CCD differencing circuit before the source charge is applied to the pipeline of the converter. However, if such a circuit is not used, the converter may be operated to compensate for the fat-zero charge Q0 by applying a reference charge packet $Q_R$ that is the maximum possible QS and then adding a fat-zero component Q0 to the comparator charge packet $Q_R - Q_R/2^n$ of each stage, while leaving the modification charge packet $Q_R/2^n$ unchanged.

Alternatively, the fat-zero component Q0 may be removed by utilizing a digital processor to subtract the Q0 component from the digital words that are generated by the converter. It is preferred to utilize a digital processor to compensate for the fat-zero component of the digitized source charges, in order to minimize the hardware requirements for the converter. However, if a processor is not available, it is generally preferable to make the fat-zero correction within the converter, as described above.

Although the apparatus of the invention has been described with respect to stages that operate independently to process a signal charge and to generate an associated bit, it should be understood that it is within the scope of the invention to minimize hardware requirements by operating the pipeline so that each stage generates two or more digital bits for a charge before the charge is passed to the next successive stage and a new charge is applied to the vacated stage. It should be understood that in such a system the comparator, the reference charge generator, and some electrodes may be time-shared within a multiple-bit pipeline stage. However, a more complex clocking scheme is required for such a time-shared system and therefore, the system will operate more slowly.

Although buffer registers 31 are employed in the apparatus of the invention to temporarily store the binary bits of the converter and to remove the time skew of the bits corresponding to particular source charge packets, other data-handling apparatus may be employed to accomplish the same functions, without departing from the spirit of the invention. For example, a digital processor may be employed to receive data bits from the respective outputs of the comparators of the converter and the data may then be arranged by the digital processor to form six-bit words corresponding to the digitized charge packets.

The invention may be embodied in other specific forms without departing from its spirit or essential characteristics. The present embodiments are, therefore, to be considered in all respects as illustrative and not restrictive, the scope of the invention being indicated by the claims rather than by the foregoing description, and all changes which come within the meaning and range of the equivalents of the claims are therefore intended to be embraced therein.

Industrial Applicability

The pipelined CCD analog-to-digital converter of the invention may be employed to rapidly convert the analog charge output data of such devices as CCD image scanners or multi-level stores to corresponding digital data that may be used by digital computers.

I claim:

1. An analog-to-digital converter for generating a digital word having a plurality of binary bits defining the magnitude of a charge packet, comprising:
   a pipeline register having an input end for receiving a serial stream of source charge packets and having serially connected register electrodes for serially passing the charge packets to an output end; and
   a plurality of digitizing stages arranged at serial locations along said pipeline register, each stage operatively associated with at least one particular register electrode of the pipeline register for comparing a source charge stored under the electrode to a first fixed reference charge for the electrode and generating a binary bit in accordance with the result of the comparison, each stage having transfer means for summing the compared source charge and a second fixed reference charge for the electrode if a particular binary bit is generated for the electrode and for storing the charge sum under a successive register electrode of the pipeline register and for transferring the compared source charge alone to said successive register electrode if another particular binary bit is generated.

2. THe converter of claim 1 wherein each digitizing stage includes,
   a reference charge generator for generating a maximum reference charge $Q_R$ corresponding to the maximum possible source charge packet that may be applied at said input end, and
   reference splitting means for dividing said maximum reference charge to form said first fixed reference charge and said second fixed reference charge.

3. The converter of claim 2 wherein said reference splitting means defines the first fixed reference charge as $Q_R - Q_R/2^n$ and the second fixed reference charge as $Q_R/2^n$, where n is an integer designating the order of the bit that is generated for the particular electrode, the first bit that is generated for the pipeline register having a designation $n = 1$.

4. The converter of claim 2 wherein said reference splitting means includes,
   a plurality of CCD charge splitting electrodes and buffer electrodes, the charge splitting electrodes arranged to alternate in insulated overlapping relation with the buffer electrodes for dividing the maximum reference charge into fractions to define the first and second fixed reference charge.

5. The converter of claim 4 wherein said plurality of CCD electrodes includes,
   a first charge splitting electrode for receiving the reference charge $Q_R$ and for dividing the reference charge in half and storing the resultant two $Q_R/2$ charges,
   a first buffer electrode for receiving and storing the two $Q_R/2$ charges of the first charge splitting electrode,
   a second charge splitting electrode for receiving the stored $Q_R/2$ charges of said first buffer electrode and storing one of the $Q_R/2$ charges and for dividing the other of the $Q_R/2$ charges in half and storing the resultant two $Q_R/4$ charges,
   successive buffer electrodes, each successive buffer electrode for receiving two equal charges and a larger additional charge from an adjacent preceding charge splitting electrode, for combining one of the two equal charges and said larger charge and storing the resultant charge and for storing the other of the two equal charges, and
   successive charge splitting electrodes, each successive charge splitting electrode for receiving two unequal charges from an adjacent preceding buffer electrode, for equally dividing the smaller of the two received charges and storing each of the resultant equal charges and for storing the larger of the two received charges.

6. The converter of claim 1 wherein said transfer means for summing includes a transfer gate operated in response to production of said particular binary bit for moving said second fixed reference charge to combine with the compared source charge under said successive register electrode.

7. The converter of claim 1 including a plurality of buffer stages for storing the binary bits generated by said digitizing stages as a source charge moves from the input end of the pipeline register to the output end of the pipeline register, particular buffer stages being arranged to store the bits of the binary word defining the magnitude of a source charge when the charge reaches the last register electrode of the pipeline register.

8. A pipelined analog-to-digital converter for generating by successive approximation a digital word having a plurality of binary bits defining the magnitude of a pipeline input source signal, comprising:
   a plurality of stage means serially connected to form a pipeline register for serially passing at least one source signal, each stage means generating a binary bit for a particular bit position of said digital word and each stage means having,
   at least one storage means for receiving and storing at least a source signal;
   reference generating means for generating a reference signal,
   splitting means for dividing the reference signal into a comparator signal component and a modification signal component, the magnitude of the comparator signal and the modification signal defined in accordance with the bit position of the binary bit of the stage means within said digital word,
   comparator means for comparing the stored source signal with the comparator signal and for generating a binary bit in accordance with the result of the comparison,
   means for passing the stored source signal to a next successive stage means after the comparator means has compared the source signal and the comparator signal, and
   transfer means responsive to the generation of a particular binary bit by said comparator means for passing the modification signal to the next successive stage means to combine the modification signal with the source signal of the next successive stage means.

9. The converter of claim 8 wherein the reference generating means for each stage means includes means for generating a reference signal $Q_R$ corresponding to the maximum expected input source signal and the splitting means for each stage means includes means for defining the comparator signal as $Q_R - Q_R/2^n$ and the modification signal as $Q_R/2^n$, where n is an integer designating the bit position of the binary bit that is generated by the stage means.

10. The converter of claim 8 wherein said comparator means includes means for receiving said stored source charge and said comparator signal at substantially the same time for comparison.

11. The converter of claim 8 wherein said comparator means includes means for sequentially receiving said stored source charge and said comparator signal for comparison.

12. The converter of claim 9 wherein the comparator means of each stage means includes means for generating a binary one if the stored source signal is greater than or equal to the comparator signal and a binary zero if the stored source signal is less than the comparator signal and said transfer means of each stage means operates to pass the modification signal to the next successive stage means when said particular binary bit is zero.

13. A pipelined CCD charge splitter for receiving input reference charge packets $Q_R$ and dividing each of the received packets into a plurality of fractional charge packets, the charge splitter comprising:
   a first charge splitting electrode and means for energizing the electrode to form two potential wells of equal charge capacity, each potential well receiving one half of the $Q_R$ input charge packet to form two $Q_R/2$ charge packets;
   a first buffer electrode arranged in insulated, overlapping relation to the first charge splitting electrode and means for energizing the first buffer electrode to form a summing potential well and a storage potential well and for de-energizing said first charge splitting electrode to move one $Q_R/2$ charge packet of the first charge splitting electrode into the summing potential well and the other $Q_R/2$ charge packet into the storage potential well;
   successive alternating charge splitting and buffer electrodes arranged in insulated, overlapping relation, the first electrode of the successive electrodes being a charge splitting electrode arranged in insulated, overlapping relation with said first buffer electrode, each successive charge splitting electrode responsive to an energization signal for forming two potential wells of equal charge capacity and an additional potential well and each successive buffer electrode responsive to an energization signal for forming a summing potential well and a storage potential well;
   means for energizing each successive charge splitting electrode and de-energizing the associated preceding buffer electrode so that the two equal charge capacity potential wells of the energized charge splitting electrode receive equal portions of the charge of the storage well of the preceding buffer electrode and the additional potential well of the energized charge splitting electrode receives the charge of the summing well of the preceding buffer electrode; and means for energizing each successive buffer electrode and de-energizing the associated preceding charge splitting electrode so that the summing potential well of the energized buffer electrode receives charge from the additional potential well and one of the equal charge capacity potential wells of the preceding charge splitting electrode and the storage potential well of the energized buffer electrode receives the charge from the other of the equal charge capacity potential wells of the preceding charge splitting electrode.

* * * * *

UNITED STATES PATENT AND TRADEMARK OFFICE
CERTIFICATE OF CORRECTION

PATENT NO. : 4,375,059
DATED : February 22, 1983
INVENTOR(S) : Eugene S. Schlig

It is certified that error appears in the above-identified patent and that said Letters Patent are hereby corrected as shown below:

Column 19, line 29, change ",onverter" to -converter-.

Claim 2, line 1, change "THe" to -The-.

Signed and Sealed this

*Twenty-fourth* Day of *May 1983*

[SEAL]

*Attest:*

DONALD J. QUIGG

*Attesting Officer*    *Acting Commissioner of Patents and Trademarks*